United States Patent
Huang et al.

(10) Patent No.: US 12,089,417 B2
(45) Date of Patent: Sep. 10, 2024

(54) SEMICONDUCTOR MEMORY DEVICES AND METHODS OF MANUFACTURING THEREOF

(71) Applicant: Taiwan Semiconductor Manufacturing Company, Ltd., Hsinchu (TW)

(72) Inventors: Chia-En Huang, Xinfeng (TW); Meng-Han Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 575 days.

(21) Appl. No.: 17/459,847

(22) Filed: Aug. 27, 2021

(65) Prior Publication Data
US 2022/0328524 A1   Oct. 13, 2022

Related U.S. Application Data

(60) Provisional application No. 63/172,169, filed on Apr. 8, 2021.

(51) Int. Cl.
| | |
|---|---|
| *H10B 51/50* | (2023.01) |
| *H01L 23/522* | (2006.01) |
| *H10B 51/20* | (2023.01) |
| *H10B 51/30* | (2023.01) |

(52) U.S. Cl.
CPC ......... *H10B 51/50* (2023.02); *H01L 23/5226* (2013.01); *H10B 51/20* (2023.02); *H10B 51/30* (2023.02)

(58) Field of Classification Search
CPC ........ H10B 51/50; H10B 51/20; H10B 51/30; H01L 23/5226
See application file for complete search history.

(56) References Cited

U.S. PATENT DOCUMENTS

| | | | |
|---|---|---|---|
| 2018/0342455 A1* | 11/2018 | Nosho | H10B 41/27 |
| 2023/0200069 A1* | 6/2023 | Nishimura | H10B 43/10 |
| | | | 257/314 |

* cited by examiner

*Primary Examiner* — David Vu
*Assistant Examiner* — Brandon C Fox
(74) *Attorney, Agent, or Firm* — FOLEY & LARDNER LLP

(57) ABSTRACT

Memory devices and a method of fabricating memory devices are disclosed. In one aspect, the method includes forming a plurality of first transistors in a first area and a plurality of second transistors in a second area and forming a stack over the second area. The method includes forming a memory array portion and an interface portion through the stack. The memory array portion includes memory strings and the interface portion includes first conductive structures extending along a lateral direction. The method further includes simultaneously forming second conductive structures in the first area and forming third conductive structures in the second area. The second conductive structures each vertically extend to electrically couple to at least one of the first transistors, and the third conductive structures each vertically extend through one of the memory strings to electrically couple to at least one of the second transistors.

20 Claims, 22 Drawing Sheets

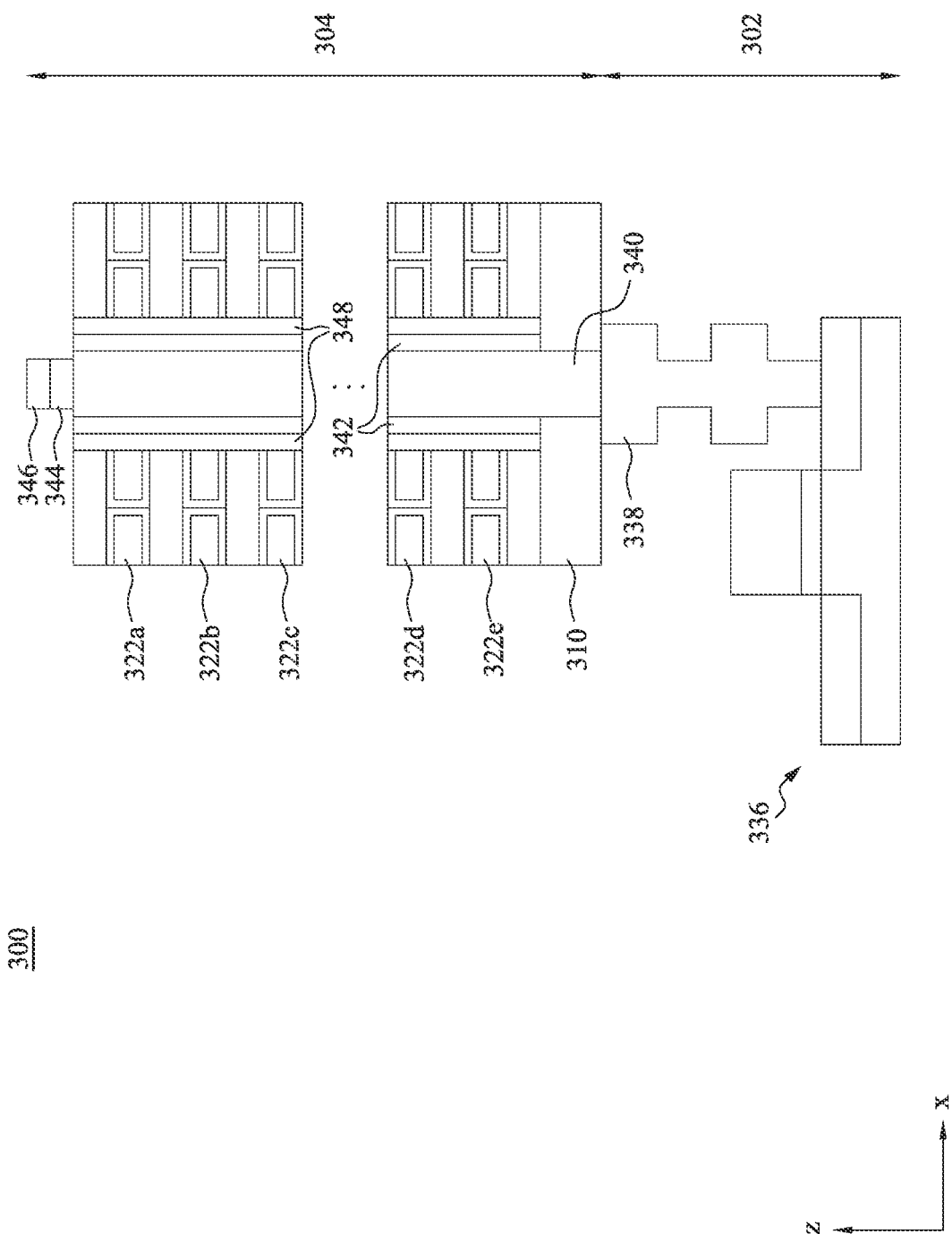

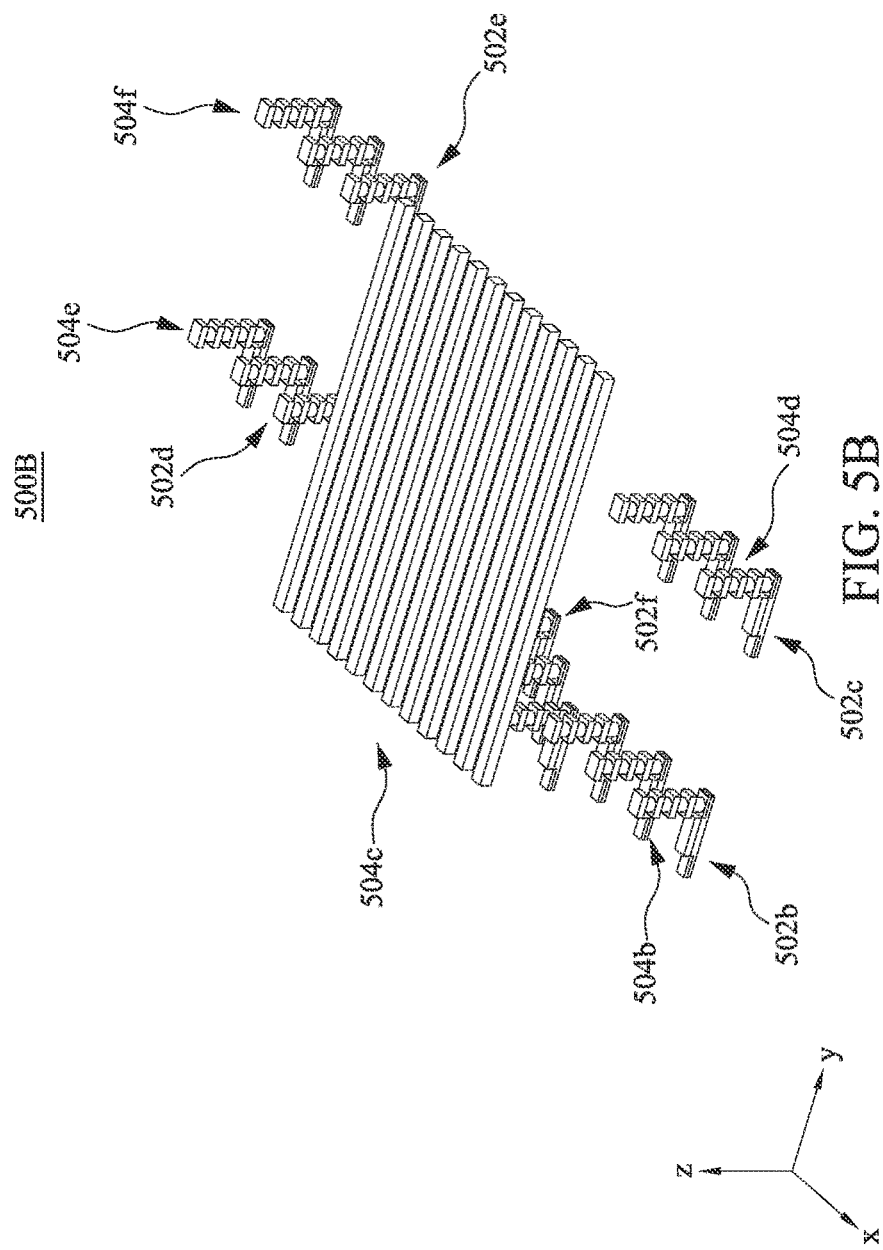
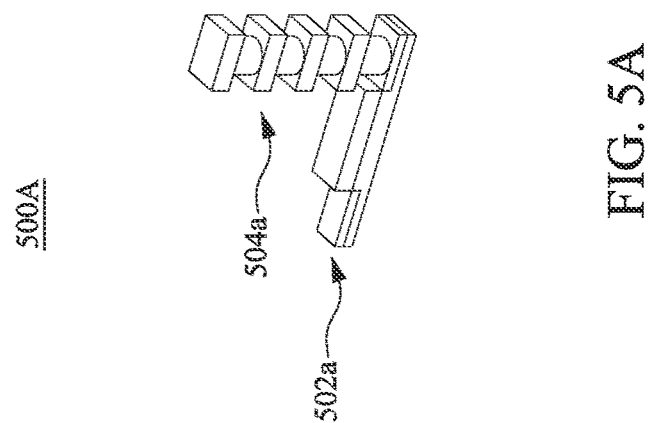
FIG. 5B
FIG. 5A

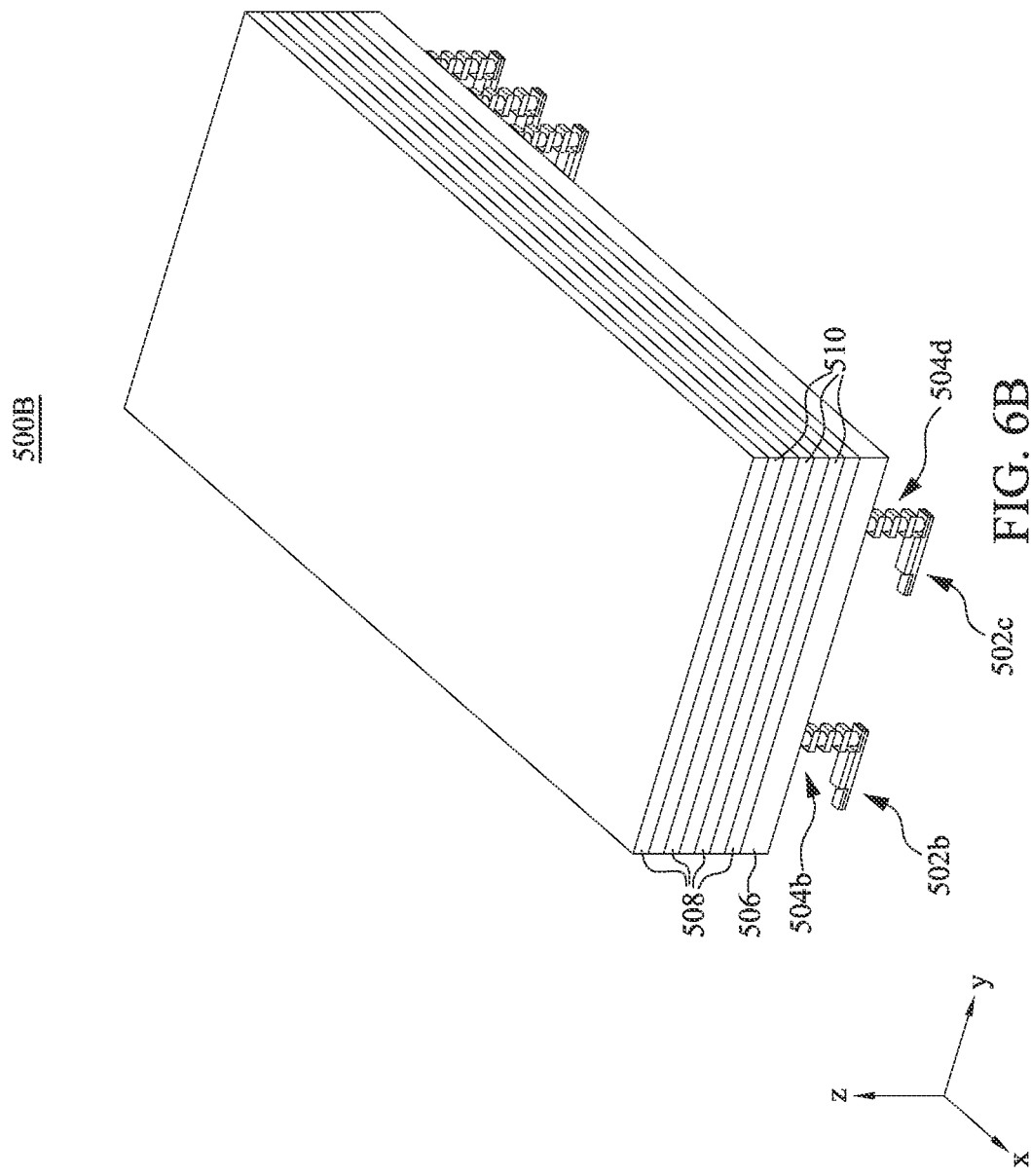
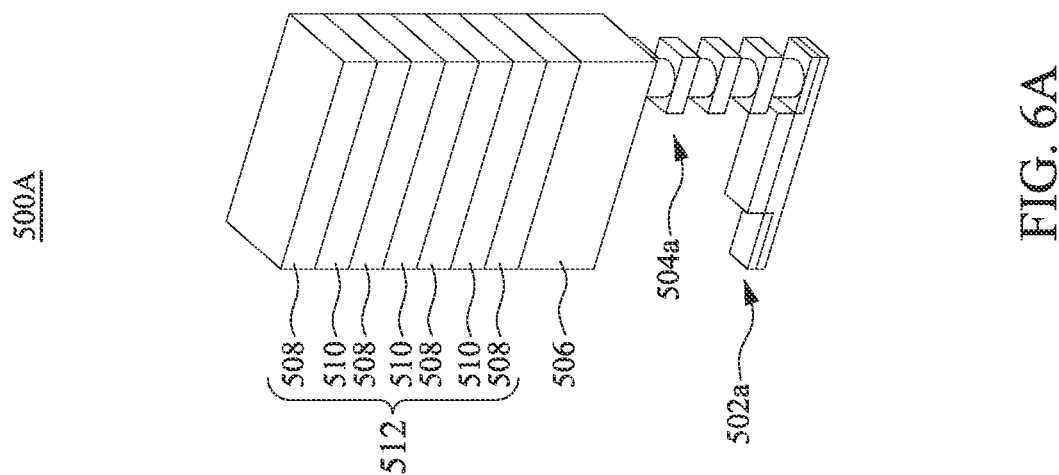
FIG. 6B
FIG. 6A

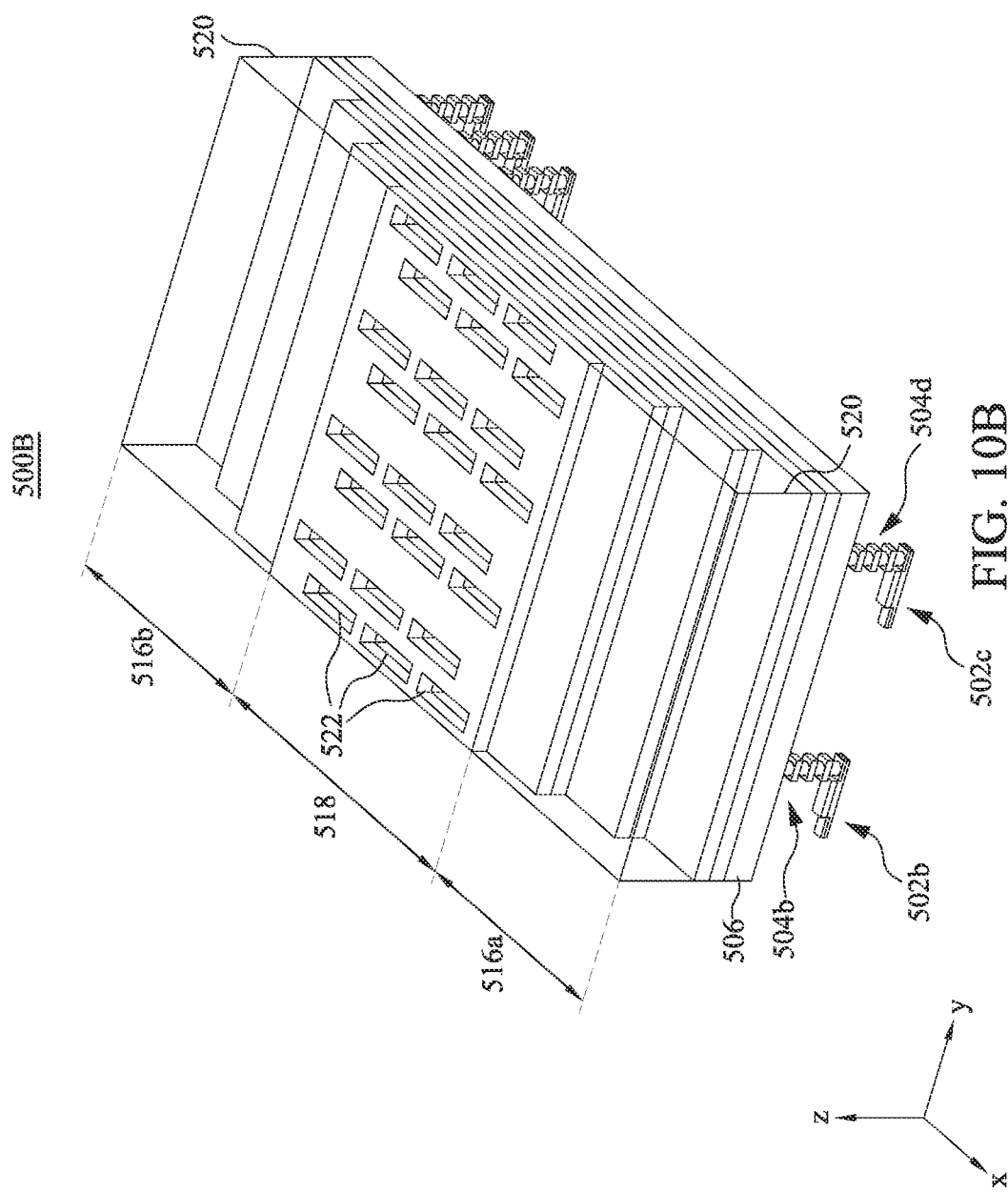
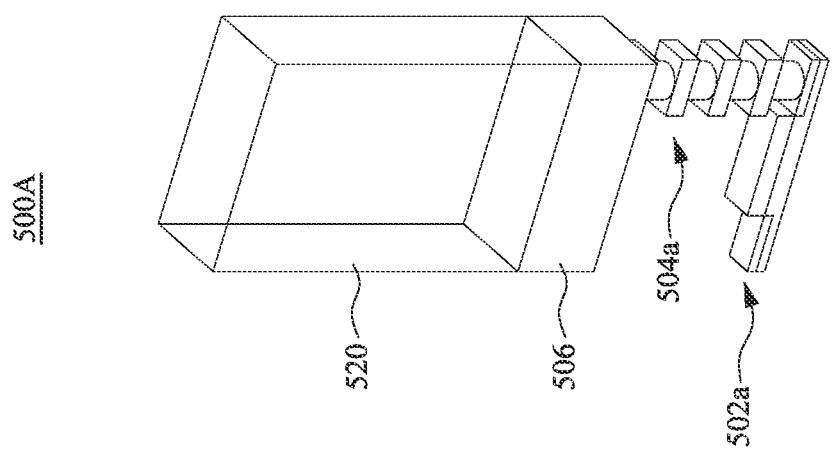
FIG. 10A
FIG. 10B

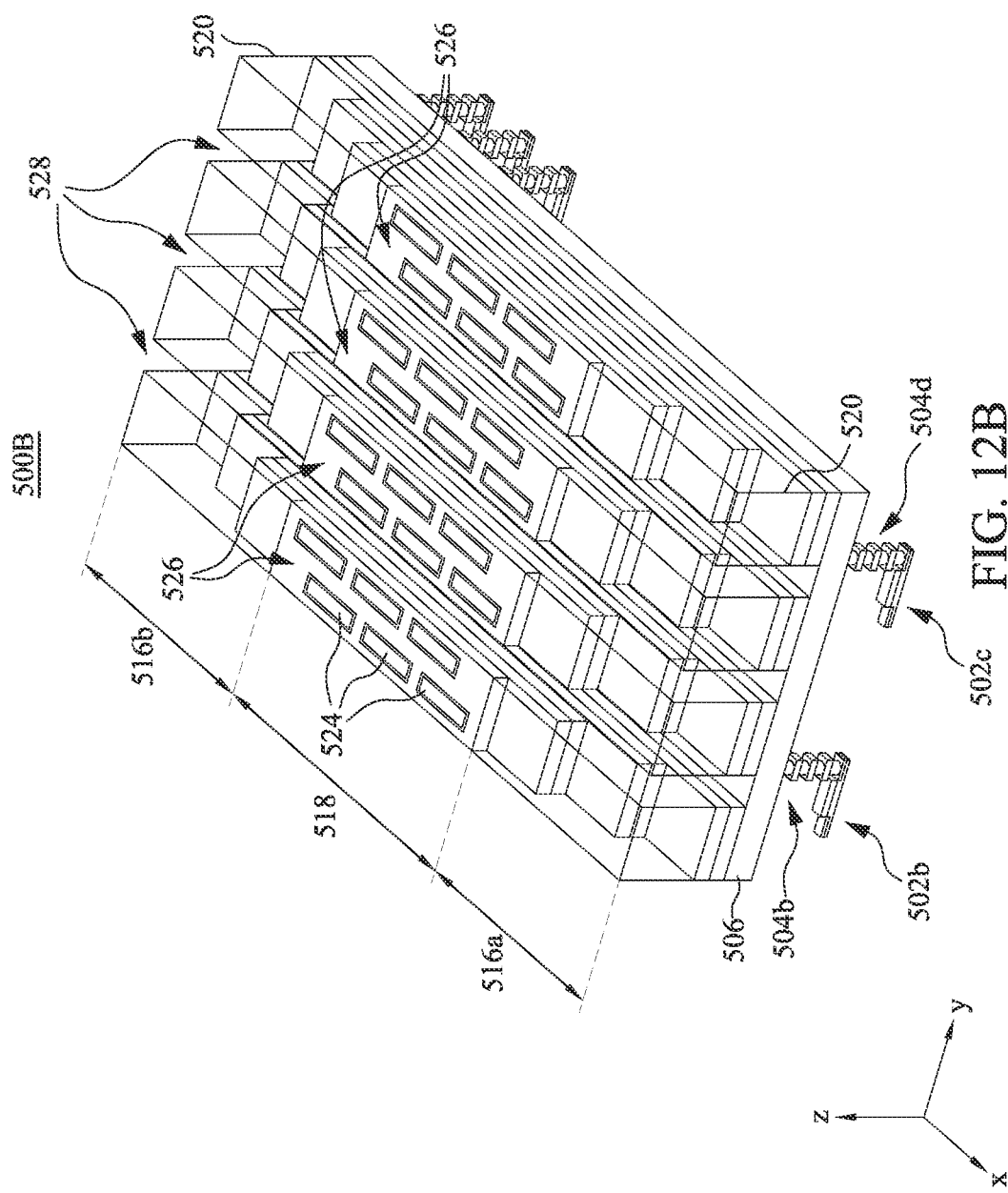
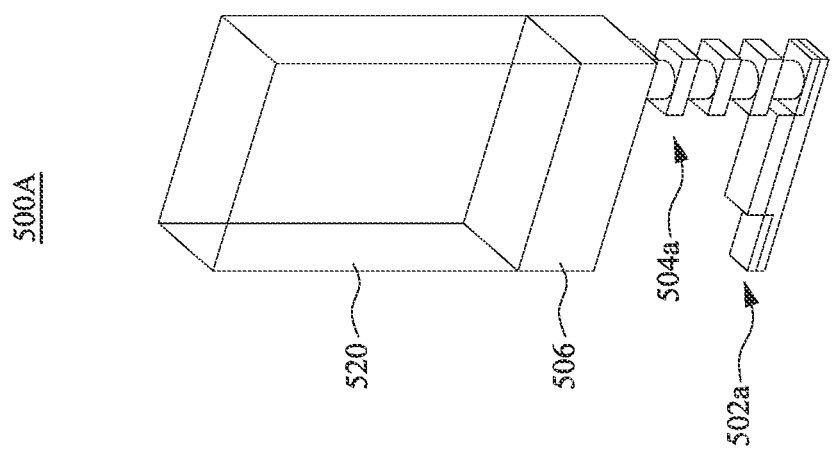
FIG. 12B
FIG. 12A

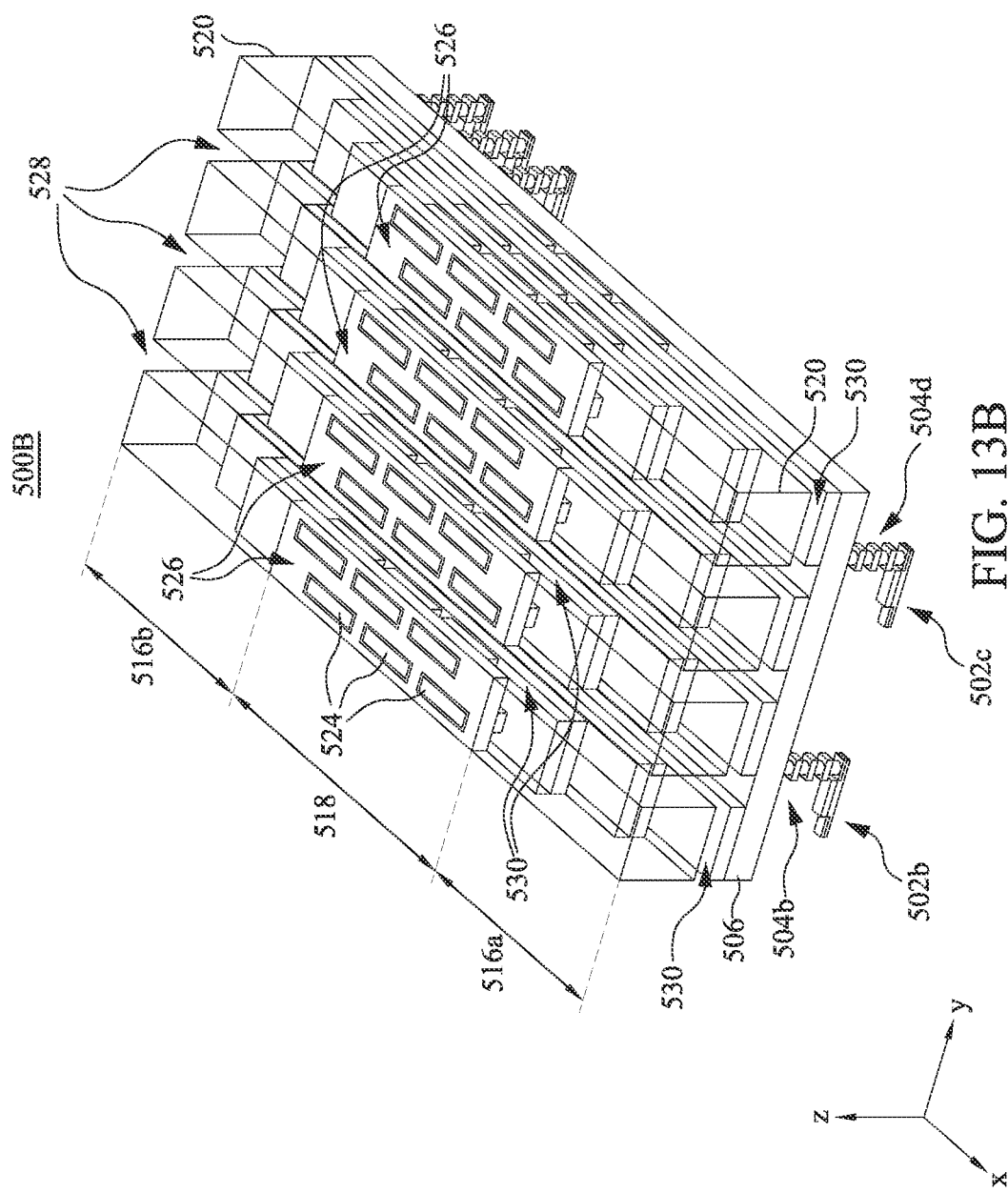
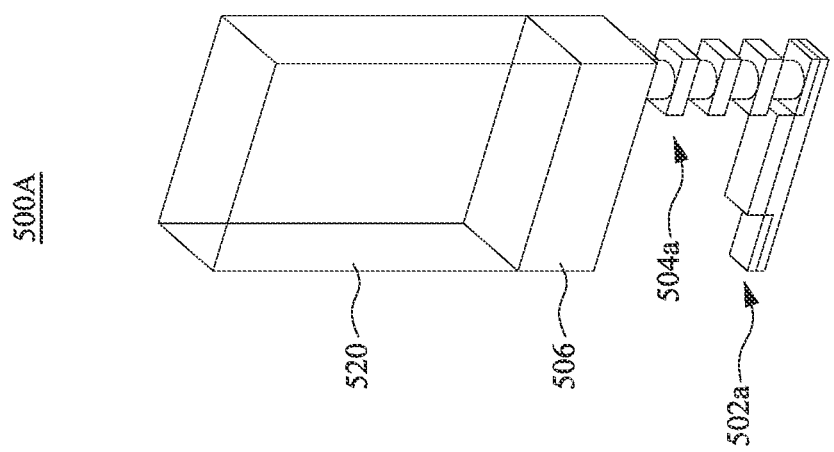
FIG. 13A
FIG. 13B

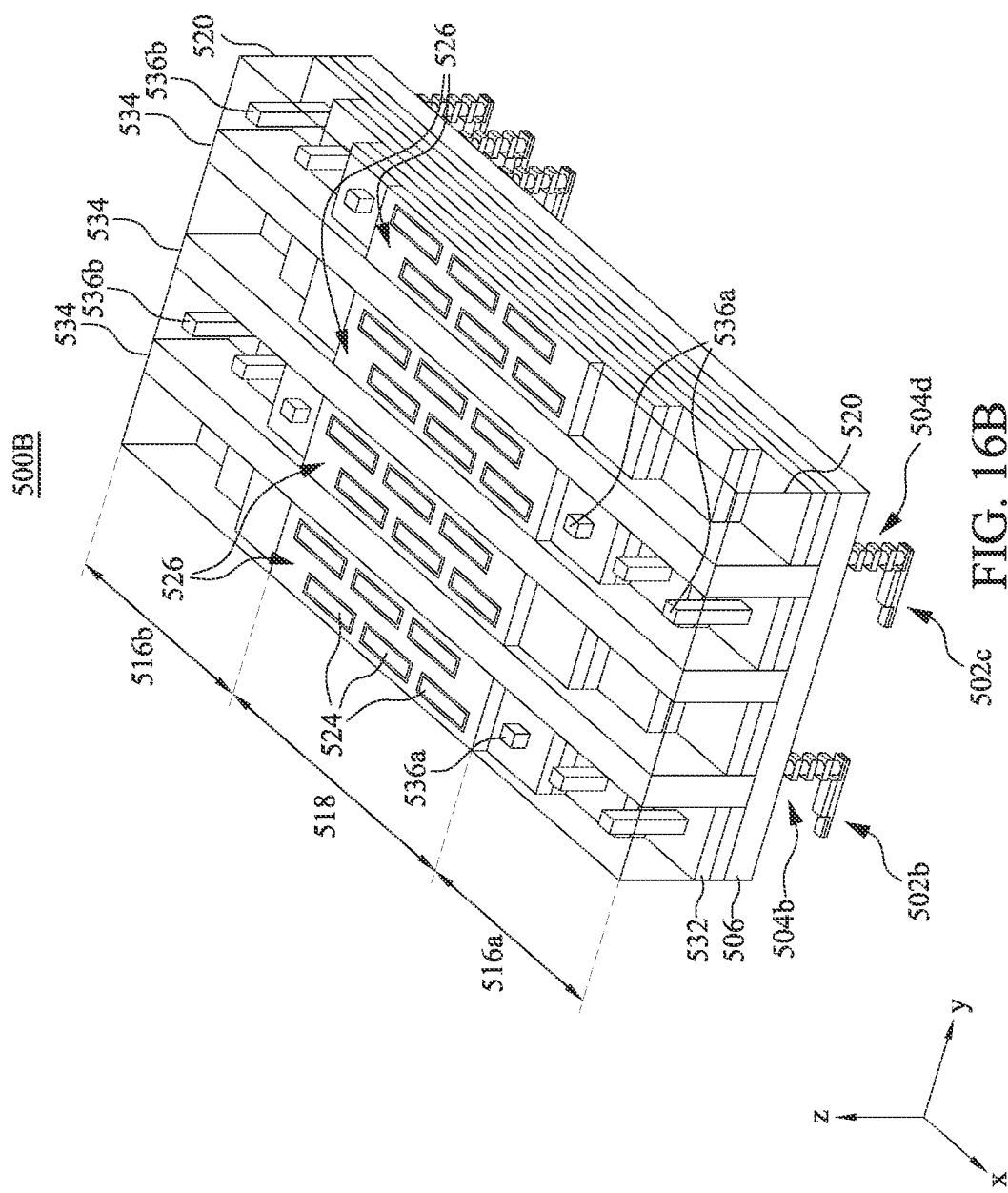
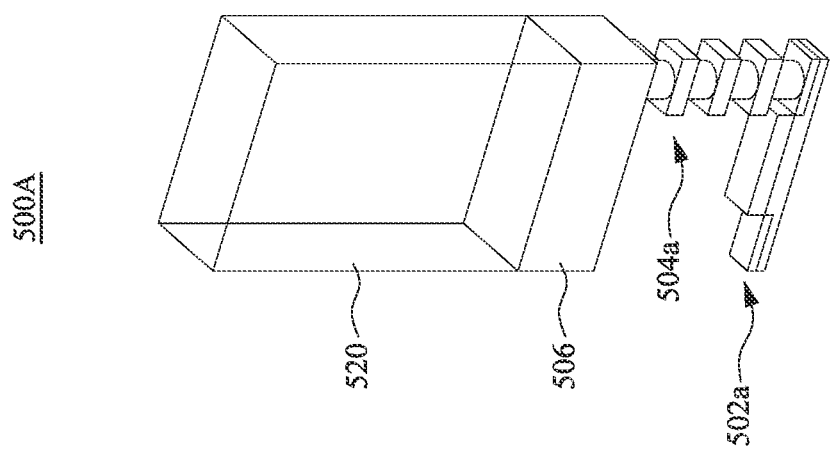
FIG. 16A
FIG. 16B

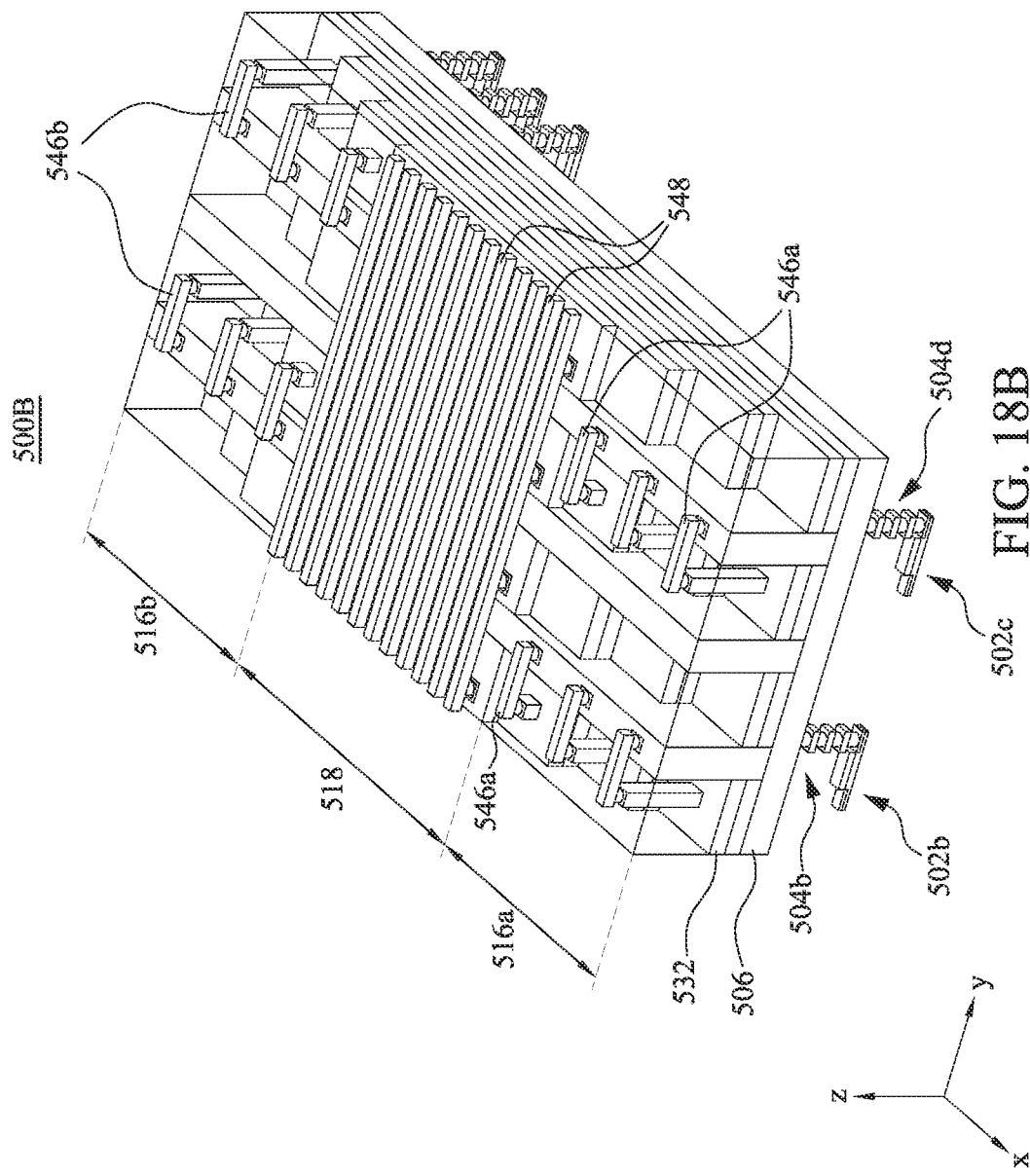
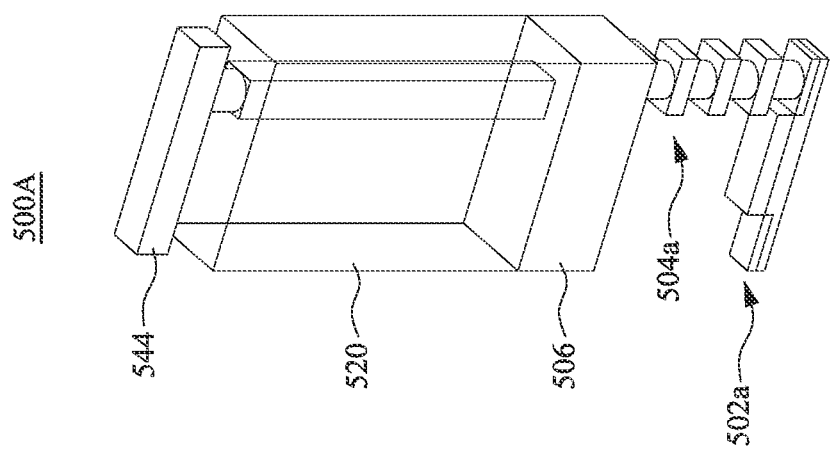
FIG. 18A
FIG. 18B

SEMICONDUCTOR MEMORY DEVICES AND METHODS OF MANUFACTURING THEREOF

CROSS-REFERENCE TO RELATED APPLICATION

This application claims priority to and the benefit of U.S. Provisional Application No. 63/172,169, filed Apr. 8, 2021, entitled "INTEGRATION OF 3D MEMORY AND PERIPHERY CIRCUITS," which is incorporated herein by reference in its entirety for all purposes.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3B is a cross sectional view of a memory portion of the memory device 200, in accordance with some embodiments.

FIGS. 5A, 5B, 6A, 6B, 7A, 7B, 8A, 8B, 9A, 9B, 10A, 10B, 11A, 11B, 12A, 12B, 13A, 13B, 14A, 14B, 15A, 15B, 16A, 16B, 17A, 17B, 18A, and 18B illustrate a memory device at various stages of fabrication, in accordance with some embodiments.

DETAILED DESCRIPTION

Figure 1:
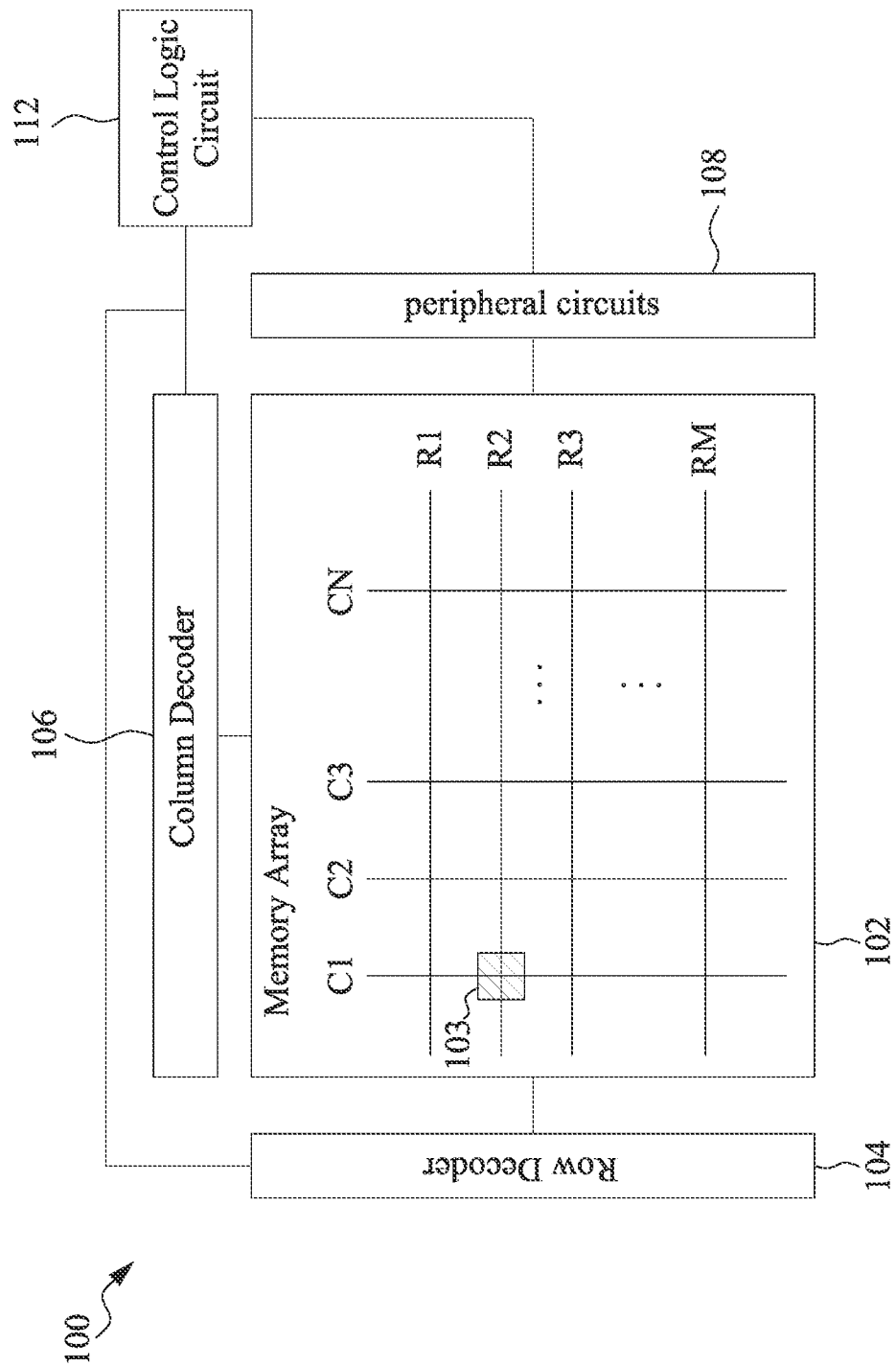
FIG. 1 illustrates a memory system, in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, a three dimensional (3D) memory device can be using a complementary metal-oxide-semiconductor (CMOS) under array (CuA) process which increases the density of the 3D memory device. In a 3D memory device formed using this process, a memory array is disposed over a word line (WL) driver, a select line (SL) driver, and/or a bit line (BL) driver. Furthermore, on the same semiconductor die, a powerline circuit, an input/output (I/O) circuit, signal processing circuit, and other peripheral circuits can be formed and connected to the 3D memory portion of the memory device using interconnect structures and vias (or conductive structures).

In a typical CuA process, vias are formed to electrically connect the WL/SL/BL drivers and the peripheral circuits to the 3D memory array. As formed, these vias do not penetrate an etch stop layer that is disposed between the WL/SL/BL drivers and the 3D memory array. This requires extra steps to form vias penetrating such an etch stop layer to connect the WL/SL/BL drivers and the peripheral circuits to the 3D memory array, which disadvantageously leads to the need for an extra mask, increased area (therefore reduced density), and/or increased fabrication costs. Thus, the existing technologies to fabricate 3D memory devices have not been entirely satisfactory in every aspect.

In the present disclosure, a CuA process, as disclosed herein, includes concurrently forming vias that can penetrate the etch stop layer in both a peripheral circuit area and a memory area of a substrate that house a number of peripheral circuits and a number of memory drivers (e.g., SL/BL/WL drivers), respectively. With the disclosed process, such vias, as formed, can readily (e.g., electrically and physically) couple to corresponding circuits/drivers, thereby significantly reducing the resources to form those extra vias as described above. Furthermore, by forming some of the vias that can readily couple a memory array to the SL/BL drivers, some interconnect structures and vias, which are typically formed inside the memory array in the existing technologies, may no longer be needed. This can advantageously free up a certain amount of real estate on the substrate (e.g., in the memory area), which can in turn increase a density of memory cells of the memory array. Accordingly, the disclosed technology provides a method of fabrication and a memory device that has lower fabrication cost, while reducing an area (i.e., increasing a density).

FIG. 1 illustrates a memory system 100, in accordance with various embodiments. In the illustrated embodiment of FIG. 1, the memory system 100 includes a memory array 102, a row decoder 104, a column decoder 106, a plurality of peripheral circuits 108, and a control logic circuit 112. Despite not being shown in FIG. 1, all of the components of the memory system 100 may be coupled to each other and/or the control logic circuit 112. Although, in the illustrated embodiment of FIG. 1, each component is shown as a separate block for the purpose of clear illustration, in some other embodiments, some or all of the components shown in FIG. 1 may be integrated together. For example, the memory array 102 may include an I/O circuit (e.g., peripheral circuits 108).

The memory array 102 is a hardware component that stores data. In one aspect, the memory array 102 is embodied as a semiconductor memory device. The memory array 102 includes a plurality of memory cells (or otherwise storage units) 103. The memory array 102 includes a number of rows $R_1, R_2, R_3 \ldots R_M$, each extending in a first direction (e.g., X-direction) and a number of columns $C_1, C_2, C_3 \ldots C_N$, each extending in a second direction (e.g., Y-direction). Each of the rows/columns may include one or more conductive structures. In some embodiments, each memory cell 103 is arranged in the intersection of a corresponding row and a corresponding column, and can be operated according to voltages or currents through the respective conductive structures of the column and row. In some embodiments, each memory cell 103 includes a transistor, e.g., a 3D memory cell.

The row decoder (or WL driver) 104 is a hardware component that can receive a row address of the memory array 102 and assert a conductive structure (e.g., a WL) at that row address. The column decoder (or SL driver and/or BL driver) 106 is a hardware component that can receive a column address of the memory array 102 and assert one or more conductive structures (e.g., a source line or bit line) at that column address. The peripheral circuits 108 include hardware components that can include a plurality of circuits, e.g., a powerline circuit, an input/output (I/O) circuit, a signal processing circuit, etc. The powerline circuit is a hardware component that can provide voltages to the memory array 102 such as power supplies VDD and VSS. The I/O circuit is a hardware component that can access (e.g., read, program) each of the memory cells 103 asserted through the row decoder 104 and column decoder 106. The signal processing circuit can include a sense amplifier circuit that can detect data from bit lines in the memory array 102. The control logic circuit 112 is a hardware component that can control the coupled components (e.g., memory array 102, row decoder 104, column decoder 106, and peripheral circuits 108).

Figure 2:
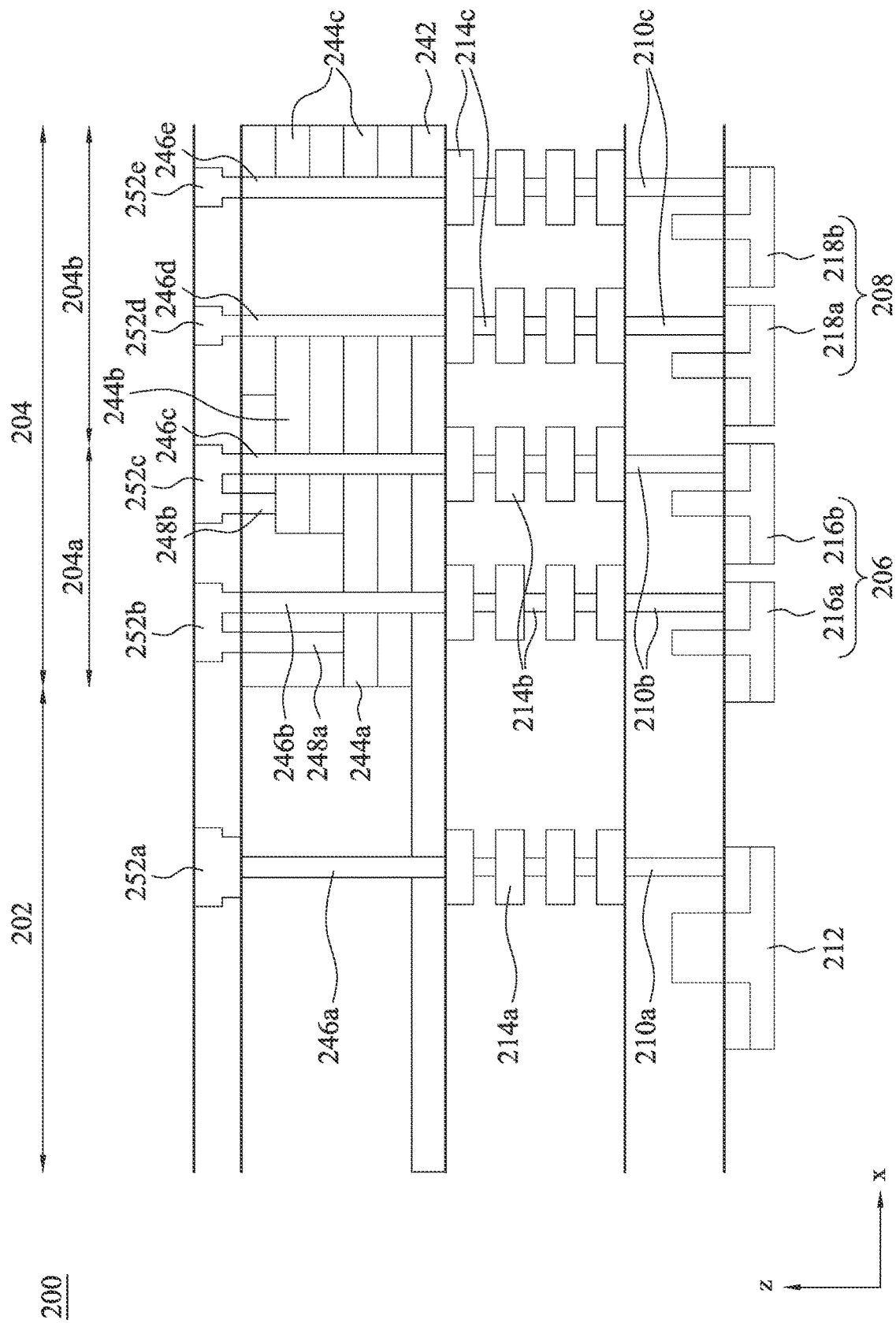
FIG. 2 illustrates a cross-sectional view of a memory device, in accordance with some embodiments.

FIG. 2 illustrates a cross-sectional view of a memory device 200, in accordance with some embodiments. The memory device 200 may include certain components of the memory system 100 of FIG. 1 such as, for example, memory array 102, row decoder 104, column decoder 106, peripheral circuits 108, etc., that are partially formed or shown in FIG. 2. In a lateral or first direction (e.g., X-direction), the memory device 200 can include a first area 202 and a second area 204. The second area 204 can include an interface portion 204a and a memory portion 204b, which includes a plurality of 3D memory cells (not shown). Although the memory device 200 is shown to have certain structures and layers, embodiments are not limited thereto, and there can be more or fewer structures and/or layers in the memory device 200, depending on embodiments.

The first area 202 can include one or more peripheral circuits (e.g., peripheral circuits 108), a via 210a, an interconnect structure 214a, a via (or conductive structure) 246a, and an interconnect structure 252a. The second area 204 can include transistors 216a, 216b, 218a, and 218b, vias 210b and 210c, WL vias 246b and 246c, SL/BL 246d and 246e, staircase vias 248a and 248b, interconnect structures 214b, 214c, 252b, 252c, 252d, and 252e, and WLs 244a, 244b, and 244c. An etch stop layer 242 can be disposed across both the first and second areas 202 and 204.

The transistors 212, 216a, 216b, 218a, and 218b can be used to control and read from the memory array (e.g., memory array 102 of FIG. 1). The transistor 212 can be a transistor in a peripheral circuit (e.g., peripheral circuits 108 of FIG. 1). The transistors 216a and 216b can be part of a WL driver 206 (e.g., row decoder 104 of FIG. 1). The transistors 218a and 218b can be part of an SL driver or a BL driver 208 (e.g., column decoder 106 of FIG. 1). Examples of the transistors 212, 216a, 216b, 218a, and 218b include, but are not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like.

Vias 210a-210c are disposed over the transistors 212, 216a, 216b, 218a, and 218b. The vias 210a-210c can electrically connect the transistors 212, 216a, 216b, 218a, and 218b to one or more interconnect structures 214a-214c which can electrically connect other transistors (not shown) to the transistors 212, 216a, 216b, 218a, and 218b to form circuits (e.g., peripheral circuits 108, row decoder 104, column decoder 106, control logic circuit 112, etc.).

The etch stop layer 242 is disposed over the interconnection structures 214a-214c. The etch stop layer 242 can function as a terminal layer for an etching operation in the course of fabricating the memory device 200. The etch stop layer 242 include a plurality of holes (or recesses) that can be filled with conductive material to electrically connect the interconnect structures 214a-214c to various driver lines (e.g., WLs 244a-244c, SL/BL 246d and 246e, etc.) via the vias 246a-246e. The interconnect structures 252a-252e are formed over the vias 246a, WL vias 246b and 246c, SL/BL 246d and 246e, respectively, to electrically connect the transistors 212, 216a, 216b, 218a, 218b to the various driver lines.

Figure 3A:
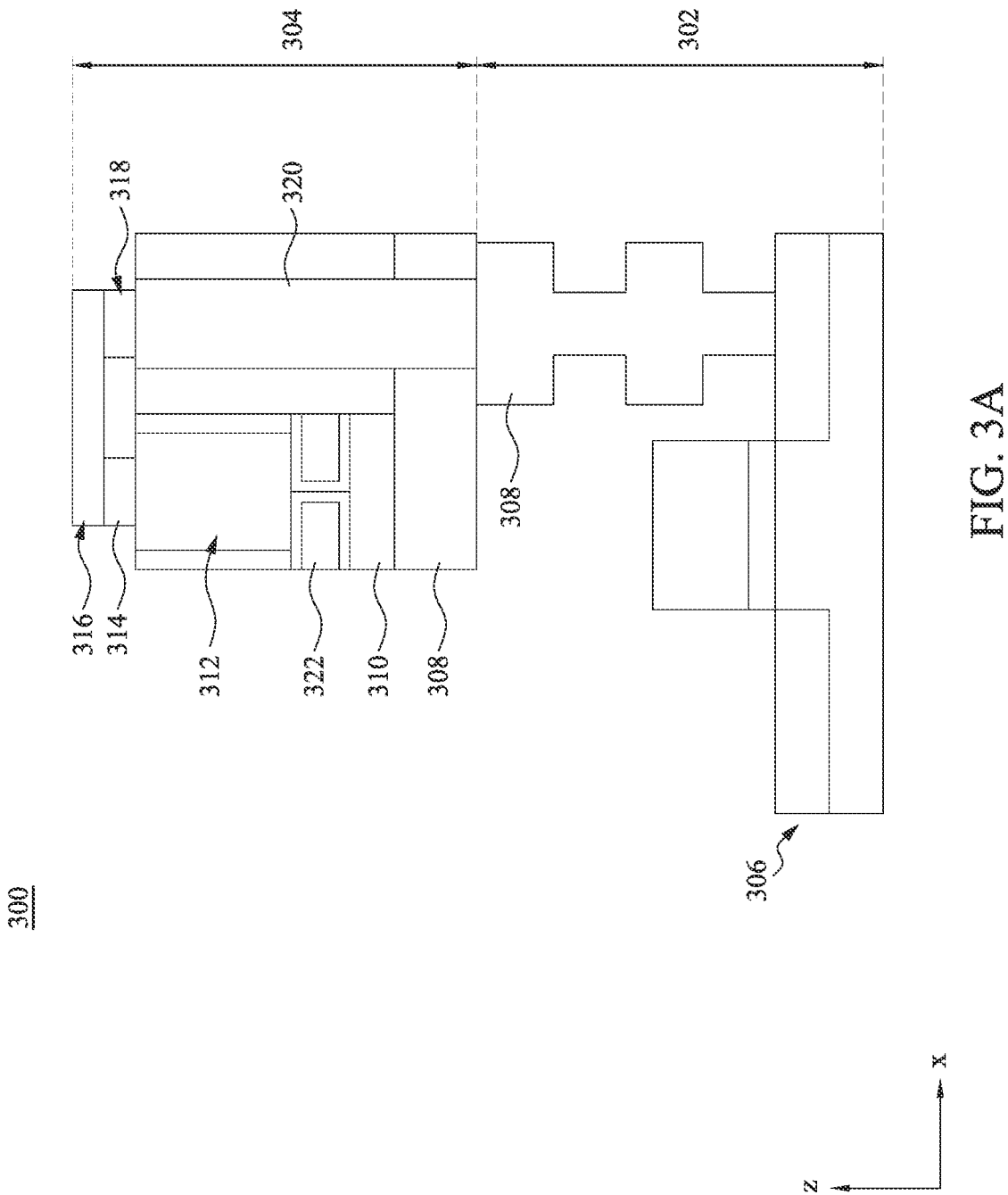
FIG. 3A is a cross sectional view of an interface portion of the memory device 200, in accordance with some embodiments.

FIG. 3A is a cross sectional view of an interface portion (e.g., interface portion 204a) of a memory device 300, in accordance with some embodiments. The memory device 300 can be similar to the memory device 200. The memory device 300 includes a CuA portion 302 and an array portion 304. The CuA portion 302 includes a transistor 306 (e.g., transistor 216a or 216b) and an interconnect structure 308 (e.g., interconnect structure 214b). The array portion 304 includes an etch stop layer 310 (e.g., etch stop layer 242), WL 322, staircase via 312, interconnect structure vias 314 and 318, interconnect structure 316, and WL via 320.

The transistor 306 can be part of a WL driver (e.g., row decoder 104 or WL driver 206). The WL 322, staircase via 312, interconnect structure vias 314 and 318, interconnect structure 316, and the WL via 320, and the interconnect structure 308 can all be formed of one or more conductive materials such that the transistor 306 can provide a WL voltage to the WL 322 which is connected to one or more transistors in the memory cells (e.g., memory cell 103).

FIG. 3B is a cross sectional view of a memory portion (e.g., memory portion 204b) of the memory device 300, in accordance with some embodiments. Similar to the interface portion, the memory portion is disposed in the second area and includes a CuA portion 302 and an array portion 304. The CuA portion 302 includes a transistor 336 (e.g., transistor 218a or 218b) and interconnect structure 338 (e.g., interconnect structure 214c). The array portion 304 includes the etch stop layer 310, a plurality of WL 322a, 322b, 322c, 322d, 322e (collectively, the WL 322), interconnect structure via 344, interconnect structure 346, channel layer 342, and memory layer 348.

The transistor 336 can be part of a SL driver or a BL driver (e.g., column decoder 106 or SL/BL driver 208) and can be used to control the stack of 3D memory cells disposed above the transistor 336. The transistor 336 can be electrically connected to the 3D memory cells through the interconnect structure 338 and the SL/BL 340. The interconnect structure 338 can be formed of a similar or the same conductive material as the interconnect structure 308, and the SL/BL 340 can be formed of a similar or the same conductive material as the WL via 320. Accordingly, the SL/BL driver can provide a SL/BL voltage to the stack of 3D memory cells disposed above the transistor 336.

In a prior approach, the interconnect structure 338 was connected to a SL/BL via that was connected to an interconnect structure at the top of the array portion 304 and then connected to a SL/BL, where the memory devices were. In contrast, as shown in FIG. 3B, the SL/BL 340 is formed in a hole in the etch stop layer 310 to connect to the interconnect structure 338. Accordingly, the area and fabrication costs are reduced.

Figure 4:
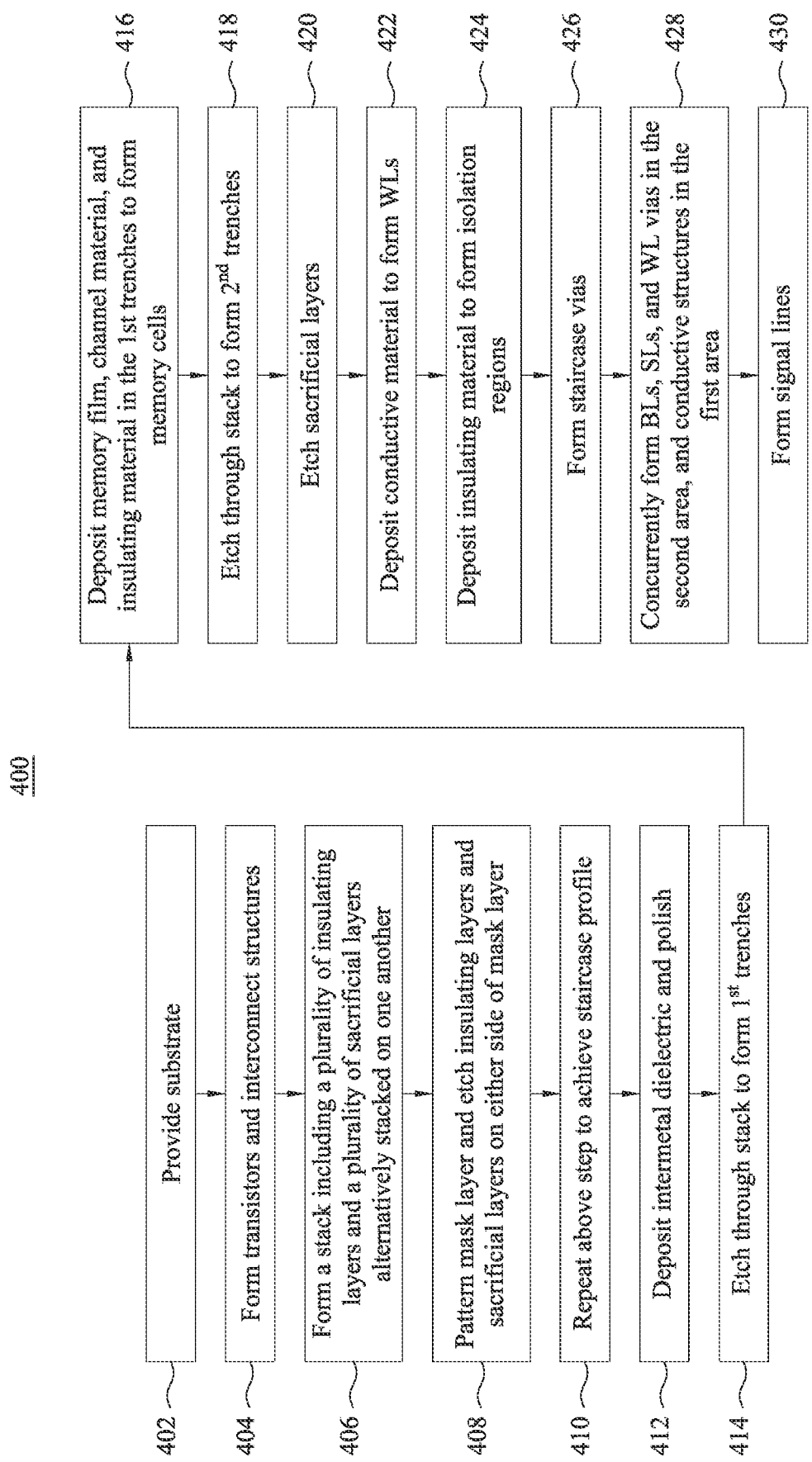
FIG. 4 illustrates a flowchart of a process for forming an example memory device, according to an embodiment.

FIG. 4 illustrates a flowchart of a process 400 for forming an example memory device 500 (e.g., the memory devices described with respect to FIGS. 1-3B), according to an embodiment. For example, at least some of the operations (or steps) of the process 400 can be used to form a 3D memory device (e.g., memory device 100, 200, or 300). It is noted that the process 400 is merely an example, and is not intended to limit the present disclosure. Accordingly, it is understood that additional operations may be provided before, during, and after the process 400 of FIG. 4, and that some other operations may only be briefly described herein. In some embodiments, operations of the process 400 may be associated with perspective and/or top views of an example 3D memory device at various fabrication stages as shown in FIGS. 5A-18B, respectively, which will be discussed in further detail below.

Furthermore, FIGS. 5A-18A (figures with figure numbers ending with "A") illustrate perspective views of a first portion 500A of the memory device 500 in the first area (e.g., first area 202) during various fabrication steps, in accordance with some embodiments, and FIGS. 5B-18B (FIGS. with figure numbers ending with "B") illustrate perspective views of a second portion 500B of the memory device 500 in the second area (e.g., second area 204) during various fabrication steps, in accordance with some embodiments. In other words, although each of the FIGS. 5A-18A and the corresponding FIGS. 5B-18B are illustrated separately from each other, the first portion 500A illustrated in each of the FIGS. 5A-18A and the second portion 500B illustrated in the corresponding FIGS. 5B-18B are different portions of the same memory device 500 after various fabrication steps, in accordance with some embodiments.

In brief overview, the process 400 starts with operation 402 of providing a substrate including a first area and a second area. The process 400 continues to operation 404 of forming transistors and interconnect structures over the substrate. The process 400 continues to operation 406 of forming a stack including a plurality of insulating layers and a plurality of sacrificial layers alternatively stacked on one another and over both the first and second areas. The process 400 continues to operation 408 of patterning a mask layer and etching the insulating layers and sacrificial layers on either side of the mask layer. The process 400 continues to operation 410 of repeating operation 408 to achieve a staircase profile. The process 400 continues to operation 412 of depositing an intermetal dielectric and polishing the intermetal dielectric. The process 400 continues to operation 414 of etching through the stack to form first trenches. The process 400 continues to operation 416 of depositing a memory film, channel material, and insulating material in the first trenches to form memory cells. The process 400 continues to operation 418 of etching through the stack to form second trenches. The process 400 continues to operation 420 of etching the sacrificial layers. The process 400 continues to operation 422 of depositing conductive material to form WLs. The process 400 continues to operation 424 of depositing insulating material to form isolation regions. The process 400 continues to operation 426 of forming staircase vias. The process 400 continues to operation 428 of concurrently forming BLs, SLs, and WL vias in the second area, and conductive structures in the first area. The process 400 continues to operation 430 of forming signal lines.

Operation 402 includes providing a substrate including a first area (e.g., first are 202) and a second area (e.g., second area 204). The substrate may be a semiconductor substrate, such as a bulk semiconductor, a semiconductor-on-insulator (SOI) substrate, or the like, which may be doped (e.g., with a p-type or an n-type dopant) or undoped. The substrate may be a wafer, such as a silicon wafer. Generally, an SOI substrate includes a layer of a semiconductor material formed on an insulator layer. The insulator layer may be, for example, a buried oxide (BOX) layer, a SiO layer, a SiN layer, or the like. The insulator layer is provided on a substrate, typically a silicon or glass substrate. Other substrates, such as a multi-layered or gradient substrate may also be used. In some embodiments, the semiconductor material of the substrate may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Corresponding to operation 404, FIGS. 5A and 5B are resulting perspective views of the first portion 500A and the second portion 500B including a plurality of transistors (transistor 502a in the first portion 500A and transistors 502b, 502c, 502d, 502e, 502f in the second portion 500B) and a plurality of interconnecting structures (interconnect structure 504a in the first portion 500A and interconnect structures 504b, 504c, 504d, 504e, 504f in the second portion 500B, collectively interconnect structures 504) at one of the various stages of fabrication, in accordance with some embodiments. The transistors 502a-502f, can be any suitable type of transistor including, but not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like. After the transistor is formed, a back-end-of-line (BEOL) process is performed to connect the interconnect structures 504a-504f over the transistors 502a-502f.

Corresponding to operation 406, FIGS. 6A and 6B illustrate the resulting perspective views of the first portion 500A and the second portion 500B including an etch stop layer 506 (e.g., etch stop layer 310) formed over the transistors 502a, 502b, 502c and the interconnect structures 504a, 504b, 504d in the first and second areas at one of the various stages of fabrication, in accordance with some embodiments. A stack 512 including a plurality of insulating layers 508 and a plurality of sacrificial layers 510 are alternatively stacked on one another on the etch stop layer 506.

The stack 512 includes a plurality of insulating layers 508 and a plurality of sacrificial layers 510 alternately stacked on top of each other in the vertical direction (e.g., the Z-direction). The insulating layers 508 and the sacrificial layers 510 are alternately disposed on top of one another in the Z-direction. For example, one of the sacrificial layers 510 is disposed over one of the insulating layers 508, then another one of the insulating layers 508 is disposed on the sacrificial layer 510, so on and so forth. As shown in FIGS. 6A and 6B, a topmost layer (e.g., a layer distal most from the substrate) and a bottommost layer (e.g., a layer most proximate to the substrate) of the stack 512 may include an insulating layer 508. While FIGS. 6A and 6B show the stack 512 as including 4 insulating layers 508 and 3 sacrificial layers 510, the stack 512 may include any number of insulating layers 508 and sacrificial layers 510 (e.g., 4, 5, 6, 7, 8, or even more). In various embodiments, if the number of sacrificial layers 510 in the stack 512 is n, a number of insulating layers 508 in the stack 512 may be n+1.

Each of the plurality of insulating layers 508 may have about the same thickness, for example, in a range of about 5 nm to about 100 nm, inclusive. Moreover, the sacrificial layers 510 may have the same thickness or different thickness from the insulating layers 508. The thickness of the sacrificial layers 510 may range from a few nanometers to few tens of nanometers (e.g., in a range of 5 nm to 100 nm, inclusive).

The insulating layers 508 and the sacrificial layers 510 have different compositions. In various embodiments, the insulating layers 508 and the sacrificial layers 510 have compositions that provide for different oxidation rates and/or different etch selectivity between the respective layers. In some embodiments, the insulating layers 508 may be formed from SiO, and the sacrificial layers 510 may be formed from SiN. The sacrificial layers 510 are merely spacer layers that are eventually removed and do not form an active component of the memory device 500.

In various embodiments, the insulating layers 508 and/or the sacrificial layers 510 may be epitaxially grown from the substrate. For example, each of the insulating layers 508 and the sacrificial layers 510 may be grown by a molecular beam epitaxy (MBE) process, a chemical vapor deposition (CVD) process such as a metal organic CVD (MOCVD) process, a furnace CVD process, and/or other suitable epitaxial growth processes. During the epitaxial growth, the crystal structure of the substrate extends upwardly, resulting in the insulating layers 508 and the sacrificial layers 510 having the same crystal orientation as the substrate. In other embodiments, the insulating layers 508 and the sacrificial layers 510 may be grown using an atomic layer deposition (ALD) process.

Figure 7B:
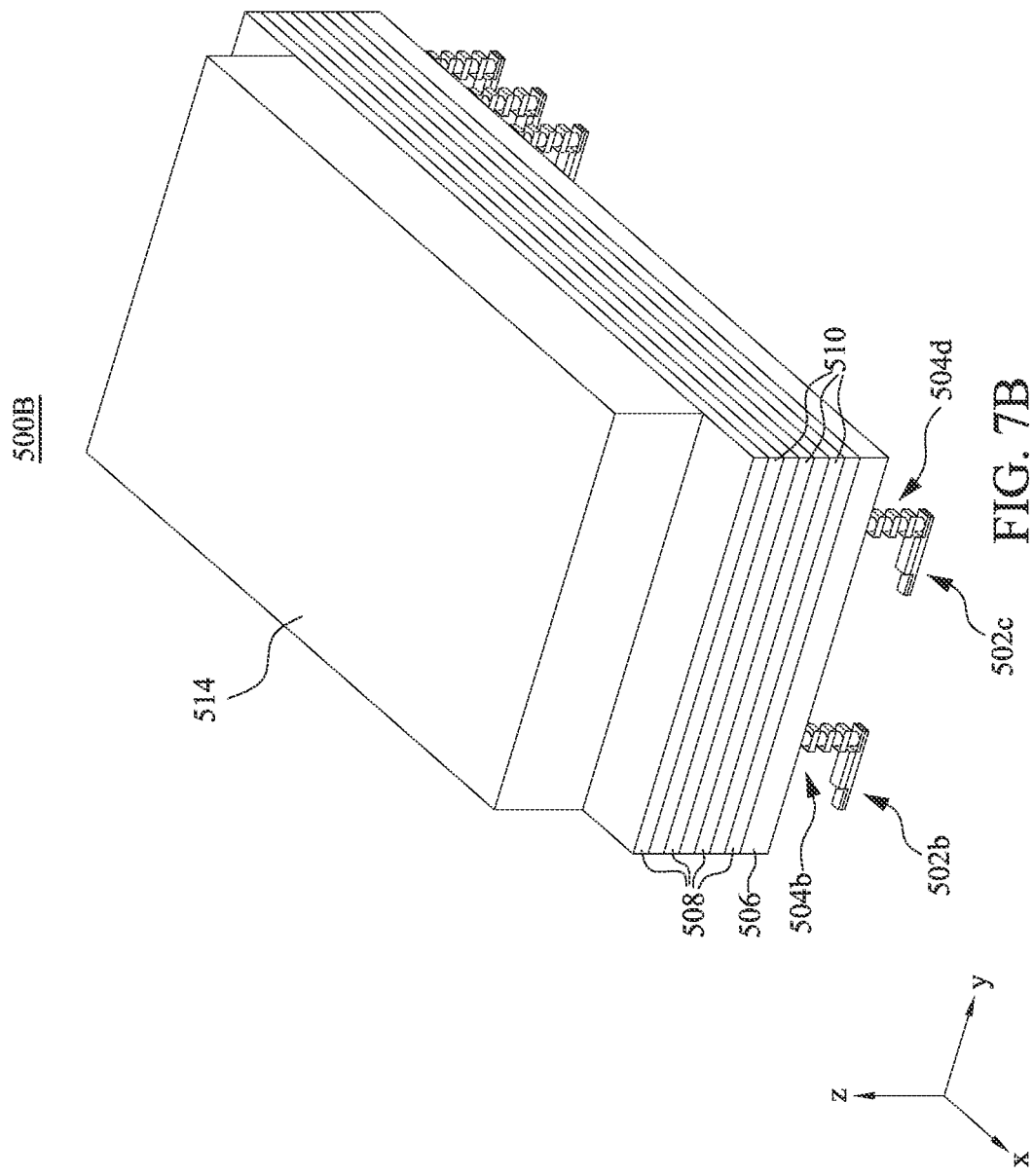
Figure 7A:
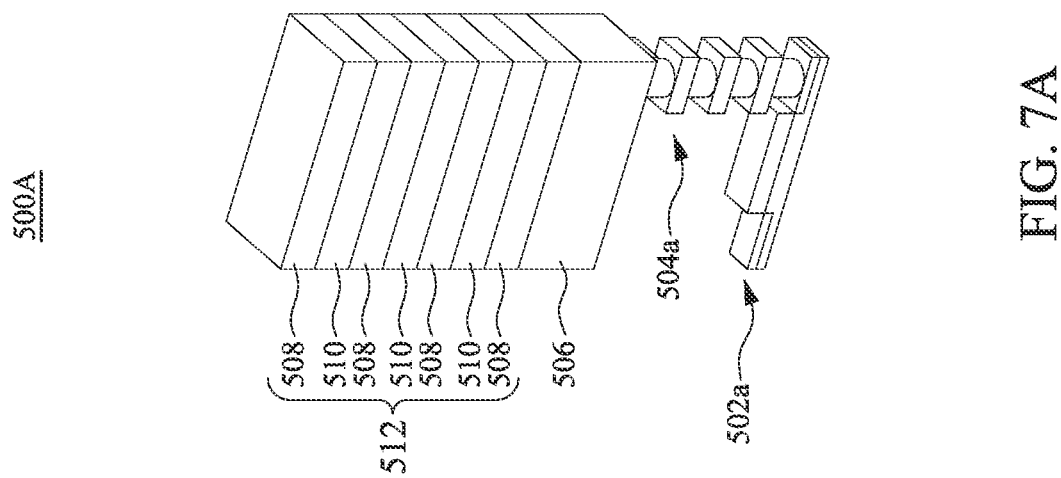

Operations 408 and 410 involve fabrication of interface portions that have a staircase or step profile in the Z-direction. Corresponding to operation 408, FIGS. 7A and 7B illustrate the resulting perspective views of the first portion 500A and the second portion 500B including a mask layer 514 deposited on top of the stack 512 (e.g., the topmost insulating layer 508) of the second portion 500B at one of the various stages of fabrication, in accordance with some embodiments. The mask layer 514 is not deposited on top of the first portion 500A. The mask layer 514 is patterned. In some embodiments, the mask layer 514 may include a photoresist (e.g., a positive photoresist or a negative photoresist), for example, a single layer or multiple layers of the same photoresist or different photoresists. In other embodiments, the mask layer 514 may include a hard mask layer, for example, a polysilicon mask layer, a metallic mask layer, or any other suitable mask layer.

The mask layer 514 is patterned to etch portions of the mask layer 514 at axial ends of the mask layer 514 in the first direction (e.g., the X-direction), so as to reduce its axial width. The mask layer 514 may be patterned using photolithography techniques. Generally, photolithography techniques utilize a photoresist material that forms the mask layer 514 and that is deposited, irradiated (exposed), and developed to remove a portion of the photoresist material, in this instance, end portions of the mask layer 514. The remaining mask layer 514 protects the underlying material, such as a portion of the stack 512 below the patterned mask layer 514, from subsequent processing steps, such as etching.

A first set or pair of insulating layers 508 and sacrificial layers 510 that include a topmost insulating layer 508 and a topmost sacrificial layer 510 on either side of the mask layer 514 in the first direction (e.g., the X-direction), are etched. The patterned mask layer 514 is used to etch the exposed portions of the topmost insulating layer 508 and the topmost sacrificial layer 510 included in the first set so as to form a step from the first set to a second set of insulating layer 508 and sacrificial layers 510 that are disposed immediately below the first set. In some embodiments, the etch may be an anisotropic etch (e.g., a reactive ion etch (RIE), neutral beam etch (NBE), deep reactive ion etch (DRIE), and the like, or combinations thereof) which selectively etches the exposed portions of the topmost insulating layer 508 and sacrificial layers 510 in the Z-direction.

In some embodiments, the etching of the first set may include a first etch that selectively etches the insulating layer 508 until the underlying sacrificial layer 510 is exposed, and a second subsequent etch that etches the sacrificial layer 510 until the underlying insulating layer 508 is exposed. Such two-step etching process may allow the underlying sacrificial layer 510 or the insulating layer 508 to serve as a etch stop such that once a portion of the layer immediately above it has been removed, so as to prevent over-etching.

Figure 8B:
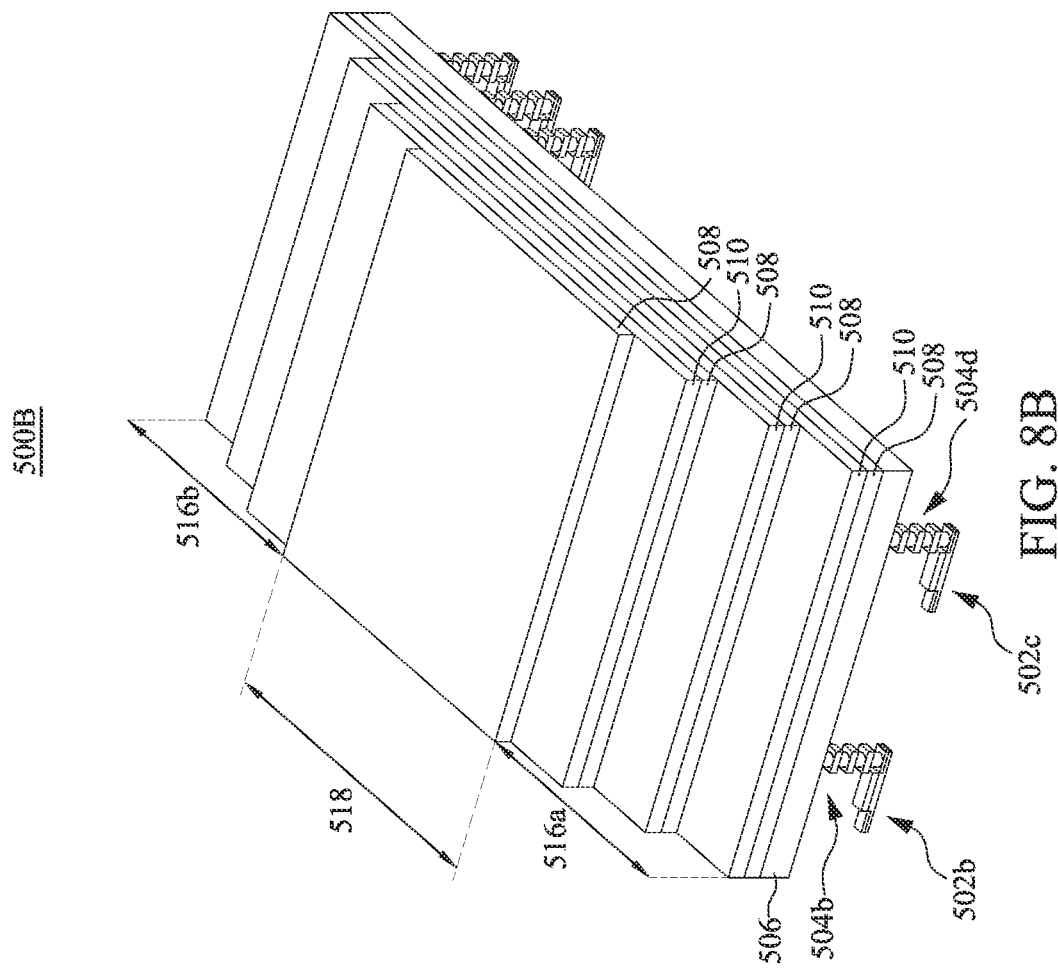
Figure 8A:
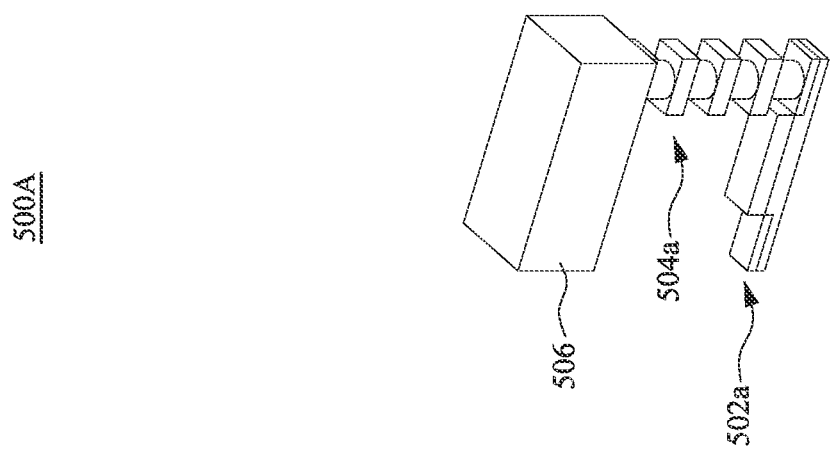

Corresponding to operation 410, FIGS. 8A and 8B illustrate the resulting perspective views of the first portion 500A and the second portion 500B including a staircase profile at one of the various stages of fabrication, in accordance with some embodiments. The mask layer 514 is again etched to reduce its width in the X-direction. Axial ends of the mask layer 514 may be etched using the same process as described with respect to operation 406. In some embodiments, a width of the portion of the mask layer 514 that is etched and removed at operation 406 is the same as width of a portion of the mask layer 514 that is etched and removed at operation 410.

As shown in FIG. 8A, the insulating layers 508 and the sacrificial layers 510 are removed from the first portion 500A to expose the etch stop layer 506. As shown in FIG. 8B, operation 410 is repeated, until steps are formed from a bottommost set of insulating layer 508 and sacrificial layers 510 to the first set of insulating layer 508 and sacrificial layers 510, and axial end portions of the stack 512 in the first direction (e.g., the X-direction) have a staircase profile in the vertical direction (e.g., the Z-direction), from the bottommost set to the first set (i.e., the topmost set) of insulating layer 508 and sacrificial layers 510. The second portion 500B (e.g., interface portion 204) includes interface portions 516a and 516b (collectively, interface portion 516) (e.g., interface portion 204a) and a memory portion 518 (e.g., memory portion 204b). The interface portion 516 includes the steps of the staircase profile and the memory portion 518 is where the 3D memory cells are going to be patterned.

Figure 9B:
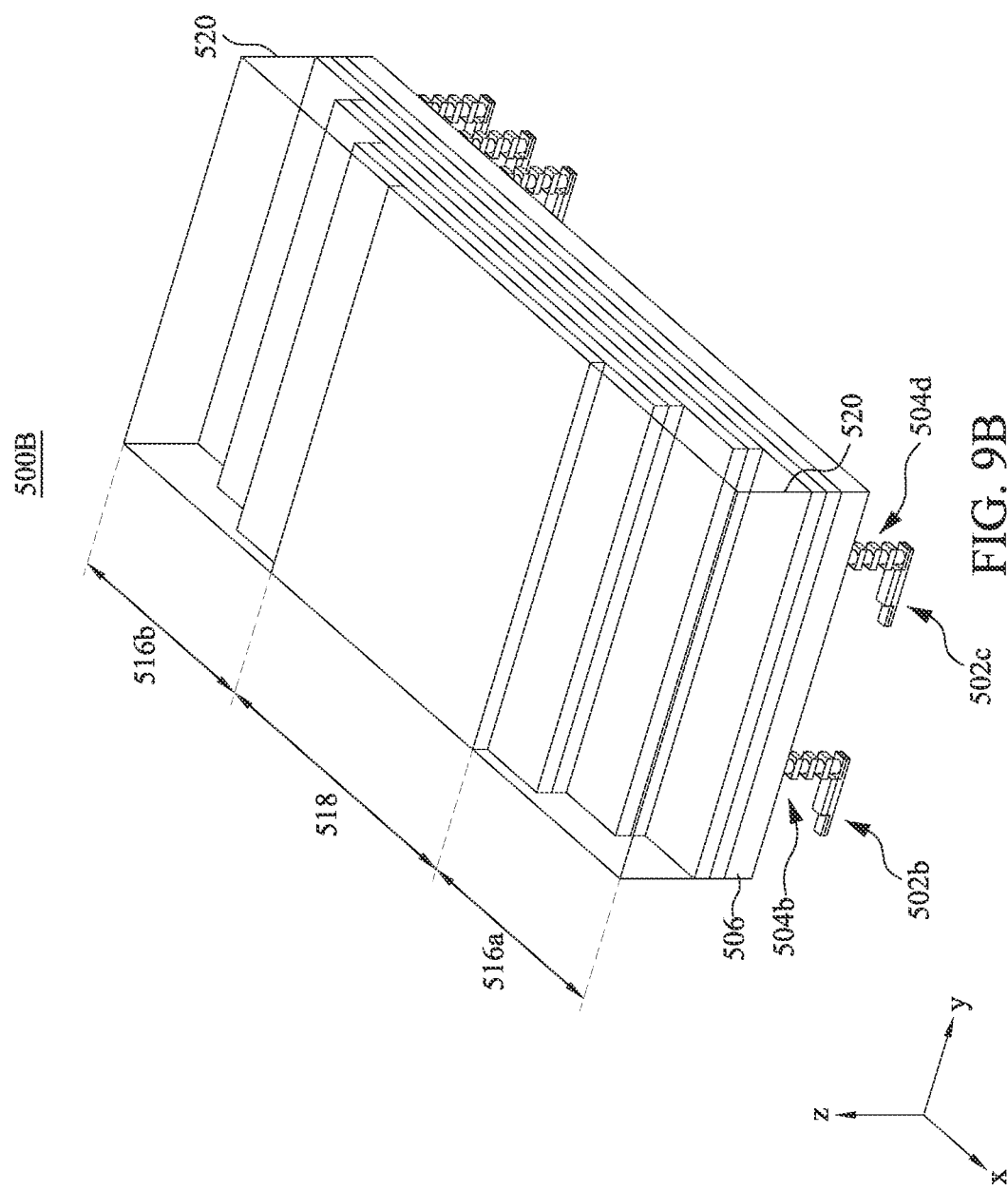
Figure 9A:
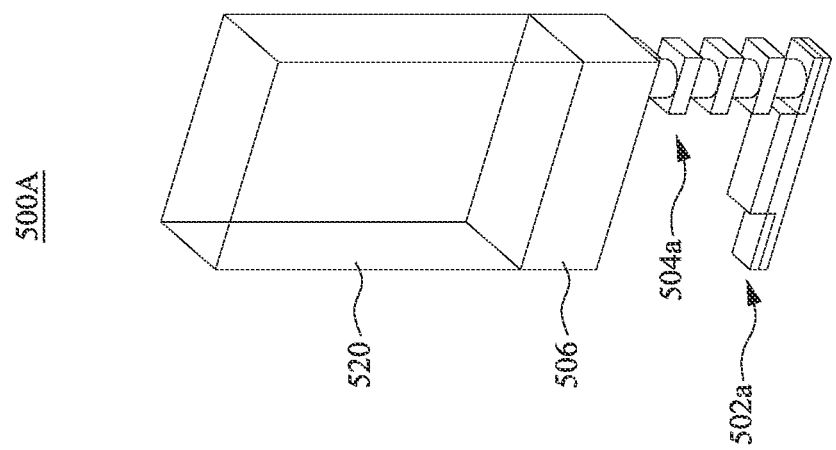

Corresponding to operation 412, FIGS. 9A and 9B illustrate the resulting perspective views of the first portion 500A and the second portion 500B including an intermetal dielectric (or interlayer dielectric or ILD) 520 deposited on the axial ends of the stack at one of the various stages of fabrication, in accordance with some embodiments. The ILD 520 is deposited on the interface portions 516a and 516b. The ILD 520 can be formed by depositing a dielectric material in bulk over the partially formed memory device 500 (e.g., a 3D memory device), and polishing the bulk dielectric back (e.g., using CMP) to the level off the topmost insulating layer 508 such that the ILD 520 is only disposed on the interface portion 516. The dielectric material of the ILD 520 may include SiO, phosphosilicate glass (PSG), borosilicate glass (BSG), boron-doped phosphosilicate Glass (BPSG), undoped silicate glass (USG), or combinations thereof.

Corresponding to operation 414, FIGS. 10A and 10B illustrate the resulting perspective views of the first portion 500A and the second portion 500B including a plurality of first trenches 522 formed in the memory portion 518 at one of the various stages of fabrication, in accordance with some embodiments. The first trenches 522 all extend along a lateral direction (e.g., the X direction). The first trenches 522 can be formed by using a first etching process. The first etching process may include, for example, a reactive ion etch (RIE) process, a neutral beam etch (NBE) process, the like, or combinations thereof. The first etching process may be anisotropic. As such, the first trenches 522, vertically extending through the stack 512, can be formed. For example, the first trenches 522 (after the first etching process) may have nearly vertical sidewalls, each of which is collectively constituted by respective etched sidewalls of the insulating layers 508 and sacrificial layers 510. Other methods of forming the first trenches 522 are within the scope of the present disclosure.

Each of the first trenches may define initial footprints of a number of memory strings, which will be discussed in further detail below. In some embodiments, the first trenches 522 may be strips (when viewed from the top) arranged in an array of rows and columns, such that the columns of the first trenches 522 are parallel to each other (e.g., spaced from each other in the Y direction), and the rows of the first trenches 522 are parallel to each other (e.g., spaced from each other in the X direction). In some embodiments, the first trenches 522 are closely spaced with respect to each other (by the remaining portions of the stack 512). Furthermore, pairs of the first trenches 522 may be formed adjacent to each other in Y-direction and staggered in the X-direction as shown in FIG. 10B. However, embodiments are not limited thereto and the first trenches 522 may be formed in any arrangement and still be within the scope of the present disclosure.

Figure 11A:
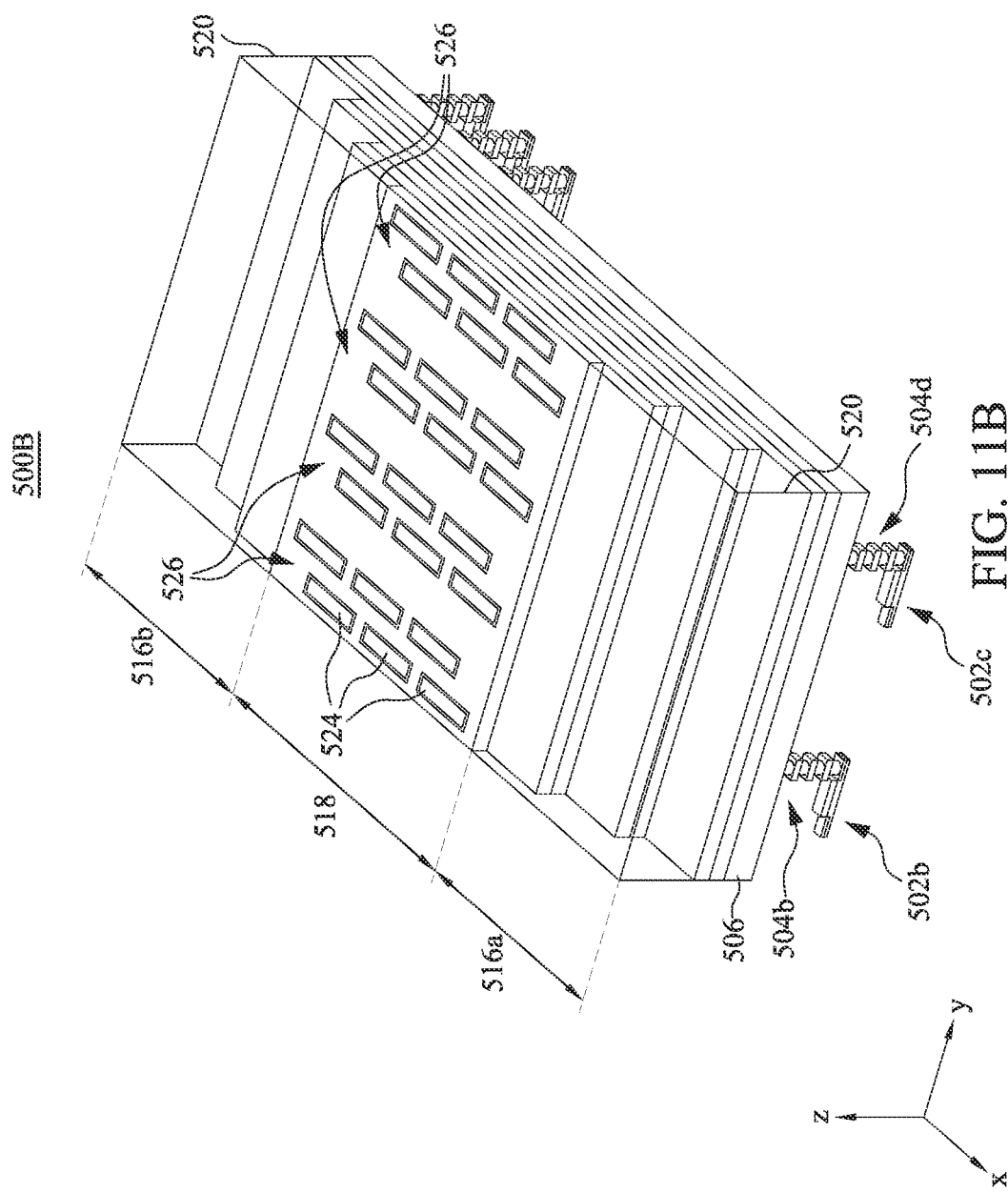
Figure 11B:
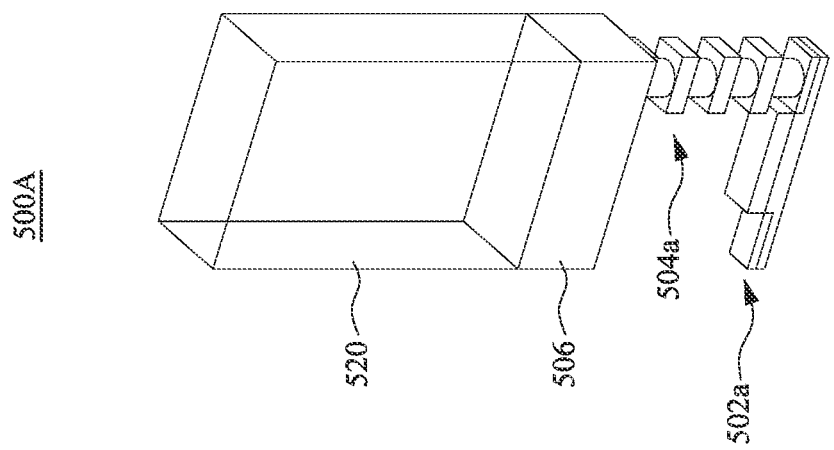

Corresponding to operation 416, FIGS. 11A and 11B illustrate the resulting perspective views of the first portion 500A and the second portion 500B including a memory layer (e.g., memory layer 348 or memory layer 530 in FIG. 13B), a channel layer (e.g., channel layer 342), and a dielectric fill material 524 (or inner spacer 524) deposited in the first trenches 522 at one of the various stages of fabrication, in accordance with some embodiments.

In various embodiments, each of the memory layers includes four portions, each of which is formed to extend along one of the sidewalls of a corresponding trench. Accordingly, in such embodiments, each of the memory layers surrounds (e.g., wraps around) a corresponding memory string. Over each ferroelectric layer, a channel layer also includes four portions that are in contact with the four portion of that memory layers, respectively.

The memory layers include a ferroelectric material. As used herein, a "ferroelectric material" refers to a material that displays a spontaneous electric polarization even when there is no applied electric field and that has the polarization that can be reversed by the application of an external electric field.

In one embodiment, the ferroelectric material includes an orthorhombic metal oxide of which a unit cell has a non-zero permanent electric dipole moment. In one embodiment, the orthorhombic metal oxide includes an orthorhombic hafnium doped zirconium oxide or an orthorhombic hafnium oxide doped with a dopant having an atomic radius that is between about 40% smaller than to about 15% larger than the atomic radium of hafnium. Other ranges of atomic radii dopant atoms are within the scope of the present disclosure. For example, the orthorhombic metal oxide can include an orthorhombic phase hafnium oxide doped with at least one of silicon, aluminum, yttrium, gadolinium and zirconium. Other materials are within the scope of the present disclosure. The atomic concentration of the dopant atoms (e.g., aluminum atoms) can be in a range from about 0.5% to about 16.6%. In one embodiment, the atomic concentration of the dopant atoms can be greater than about 1.0%, about 2.0%, about 3.0%, about 5.0%, about 7.5%, and/or about 10%. Alternatively or additionally, the atomic concentration of the dopant atoms can be less than about 15%, about 12.5%, about 10%, about 7.5%, about 5.0%, about 3.0%, and/or about 2.0%. Other values and ranges of atomic concentration dopant atoms are within the scope of the present disclosure.

The orthorhombic phase of the orthorhombic metal oxide can be a doping-induced non-centrosymmetric crystalline phase that generates a remanent dipole moment upon application and removal of an external electric field. Specifically, polarization of the oxygen atoms with respect to the metal atoms in the orthorhombic metal oxide can induce non-centrosymmetric charge distribution due to the positions (e.g., up or down positions) of the oxygen atoms in the orthorhombic lattice. Other orthorhombic phases are within the scope of the present disclosure.

The ferroelectric material (of the memory layers) can be deposited over the substrate as a continuous liner structure, for example, by a conformal deposition method such as atomic layer deposition (ALD) or chemical vapor deposition (CVD). For example, a metal-organic precursor gas and oxygen gas can be alternately or simultaneously flowed into a processing chamber to deposit the ferroelectric material. Other methods of depositing the memory layers are within the scope of the present disclosure. The deposited material of the ferroelectric material can be annealed at an elevated temperature that induces formation of the orthorhombic phase in the ferroelectric material. As a non-limiting example, temperature for formation of the orthorhombic metal oxide material in the ferroelectric material can be in a range from about 450 degrees Celsius to about 850 degrees Celsius, and typically has a window of about 200 degrees Celsius that depends on the composition of the metal oxide. Other temperature values and ranges for depositing the ferroelectric material are within the scope of the present disclosure. After deposition, the ferroelectric material can be annealed at a temperature of about 500 to about 850 degrees Celsius, such as about 500 to about 700, such as about 550 to about 600 degrees Celsius to increase the amount of the orthorhombic phase in the ferroelectric material. Other temperature values and ranges for annealing the ferroelectric material are within the scope of the present disclosure.

The average thickness of the ferroelectric material can be in a range from about 5 nm to about 30 nm, such as from about 6 nm to about 12 nm, although lesser and greater average thicknesses can also be employed. Other ranges of average thickness are within the scope of the present disclosure. As used herein, a "thickness" refers to the average thickness unless indicated otherwise. The ferroelectric material can have a thickness variation that is less than about 30% from an average thickness. In one embodiment, the thickness variation of the ferroelectric material can be less than about 20%, less than about 10%, and/or less than about 5% of the average thickness of the ferroelectric material. Other ranges of thickness variation are within the scope of the present disclosure.

The channel layer includes a semiconductor material such as at least one elemental semiconductor material, at least one III-V compound semiconductor material, at least one II-VI compound semiconductor material, at least one organic semiconductor material, or other semiconductor materials. In one embodiment, the semiconductor material includes amorphous silicon or polysilicon. Other materials are within the scope of the present disclosure. In one embodiment, the semiconductor material can have a doping of the first conductivity type. Other conductivity types are within the scope of the present disclosure.

The semiconductor material (of the channel layer) can be formed over the substrate as a continuous liner structure, for example, by a conformal deposition method such as low pressure chemical vapor deposition (LPCVD). Other methods of forming the semiconductor material are within the scope of the present disclosure. The thickness of the semiconductor material can be in a range from about 3 nm to about 30 nm, although lesser and greater thicknesses can also be employed. Other ranges of thickness are within the scope of the present disclosure. In one embodiment, the semiconductor material can have a doping of the first conductivity type. Other conductivity types are within the scope of the present disclosure.

To form the memory layers and the channel layer (as shown in FIG. 3B), the above-mentioned ferroelectric material and semiconductor material may be sequentially formed over the substrate. Each of the ferroelectric material and semiconductor material may be formed as a continuous liner structure over the substrate. In various embodiments, the first trenches 522 cannot be completely filled by the ferroelectric material and semiconductor material. Next, an anisotropic etching process may be performed to pattern or otherwise separate the continuous ferroelectric material and semiconductor material. Other methods of patterning are within the scope of the present disclosure. Further, a dielectric fill material 524 can be deposited over the substrate to fill any unfilled volume within the first trenches 522. The dielectric fill material 524 includes a dielectric material such as, for example, silicon oxide, organosilicate glass, an otherwise low-k dielectric material, or combinations thereof. Other materials are within the scope of the present disclosure. The dielectric fill material 524 can be deposited by a conformal deposition method such as low pressure chemical vapor deposition (LPCVD), or by a self-planarizing deposition process such as spin coating. Other methods of depositing the dielectric fill material 524 are within the scope of the present disclosure. Following the deposition of the dielectric fill material 524, a CMP process may be performed to remove any excess dielectric fill material. Other methods of removing excess dielectric fill material are within the scope of the present disclosure.

Upon depositing the memory layers and the channel layer in the first trenches 522, a number of memory strings can be formed (or isolated). For example in FIG. 11B, a memory string 526 can be formed by the memory layer and the channel layer. The memory string 526 includes four memory cells vertically disposed at three different tiers, which are to be controlled (e.g., gated) by respective WLs formed in later stages. Similarly, a number of memory strings can each be formed by the memory layers and the channel layer. Further, each memory cell includes a region (or portion) of the vertically extending the memory layers and a region (or portion) of the vertically extending the channel layer. Although three different tiers are shown in the illustrated embodiment of FIG. 11B, it should be understood that the memory device 500 can include any number of tiers, while remaining within the scope of the present disclosure.

Corresponding to operation 418, FIGS. 12A and 12B illustrate the resulting perspective views of the first portion 500A and the second portion 500B including a plurality of second trenches 528 extending in the first direction (e.g., the X-direction) at one of the various stage of fabrication, in accordance with some embodiments. The second trenches 528 extending in the X-direction, have been formed through the stack 512 up to the etch stop layer 506 by etching the stack 512 and the ILD 520 in the Z-direction. The etching process for forming the plurality of second trenches 528 may include a plasma etching process, which can have a certain amount of anisotropic characteristic. For example, the second trenches 528 may be formed, for example, by depositing a photoresist or other masking layer on a top surface of the memory device 500, i.e., the top surface of the topmost insulating layer 508 of the stack and a top surface of the ILD 520, and a pattern corresponding to the second trenches 528 defined in the masking layer (e.g., via photolithography, e-beam lithography, or any other suitable lithographic process). In other embodiments, a hard mask may be used.

Subsequently, the memory portion 518 and the interface portions 516a and 516b may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the second trenches 528. As a non-limiting example, a source power of about 10 Watts to about 3,000 Watts, a bias power of about 0 watts to about 3,000 watts, a pressure of about 1 millitorr to about 5 torr, and an etch gas flow of about 0 sccm to about 5,000 sccm may be used in the etching process. However, it is noted that source powers, bias powers, pressures, and flow rates outside of these ranges are also contemplated. As shown in FIG. 12B, the etch used to form the plurality of second trenches 528 etches through each of the sacrificial layers 510 and insulating layers 508 of the stack 512 such that each of the plurality of second trenches 528 extend from the topmost insulating layer 508 through the bottommost insulating layer 508 to the etch stop layer 506.

Corresponding to operation 420, FIGS. 13A and 13B illustrate the resulting perspective views of the first portion 500A and the second portion 500B including exposed surfaces of the memory layer after the sacrificial layers 510 have been etched at one of the various stages of fabrication, in accordance with some embodiments. Each of the sacrificial layers 510 may be recessed (e.g., removed) laterally (e.g., along the Y-direction) to generate recesses 530, in place of the sacrificial layers 510. The sacrificial layers 510 can be recessed by performing a second etching process that etches the sacrificial layers 510 selective to the insulating layers 508 through the second trenches 528. Alternatively stated, the insulating layers 508 may remain substantially intact throughout the second etching process. As such, the second trenches 528 (after the second etching process) can each include its inner sidewalls present in a step-like profile. Other methods of recessing the sacrificial layers 510 are within the scope of the present disclosure.

The second etching process can include a wet etching process employing a wet etch solution, or can be a gas phase (dry) etching process in which the etchant is introduced in a vapor phase into the first trenches (dotted lines). In the example where the sacrificial layers 510 include silicon nitride and the insulating layers 508 include silicon oxide, the second etching process can include a wet etching process in which the memory device 500 is immersed within a wet etch tank that includes phosphoric acid, which etches silicon nitride of the sacrificial layer 510 selective to silicon oxide, silicon, and various other materials of the insulating layers 508. Other methods of etching the sacrificial layer 510 are within the scope of the present disclosure.

Figure 14B:
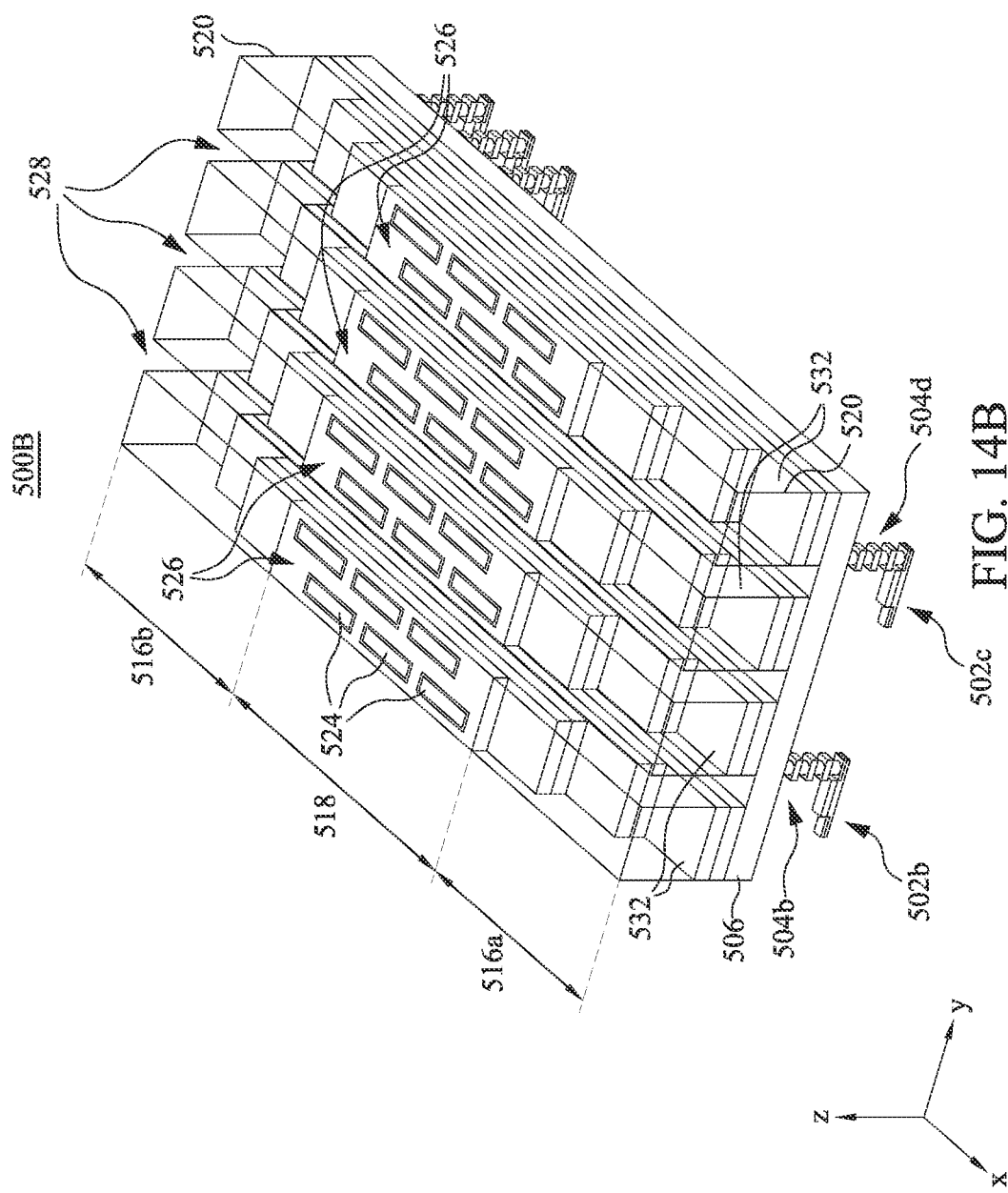
Figure 14A:
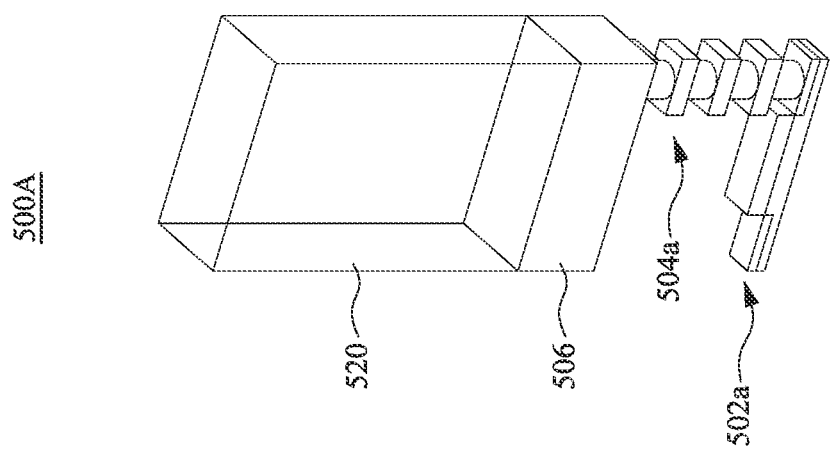

Corresponding to operation 422, FIGS. 14A and 14B illustrate the resulting perspective views of the first portion 500A and the second portion 500B including a plurality of WLs 532 (e.g., WL 322) are formed at one of the various stages of fabrication, in accordance with some embodiments. Each WL 532 is coupled to a number of memory cells disposed along a certain trench in each tier.

The WLs 532 can be formed by filling recesses 530 with a metallic fill layer. The metallic fill layer includes at least one metal material selected from the group comprising tungsten, copper, cobalt, ruthenium, titanium, tantalum, or combinations thereof. Other materials are within the scope of the present disclosure. The metallic fill layer can be deposited by a conformal deposition method, which can be, for example, chemical vapor deposition (CVD), atomic layer deposition (ALD), electroless plating, electroplating, or a combination thereof. Other methods of depositing the metallic fill layer are within the scope of the present disclosure.

Figure 15B:
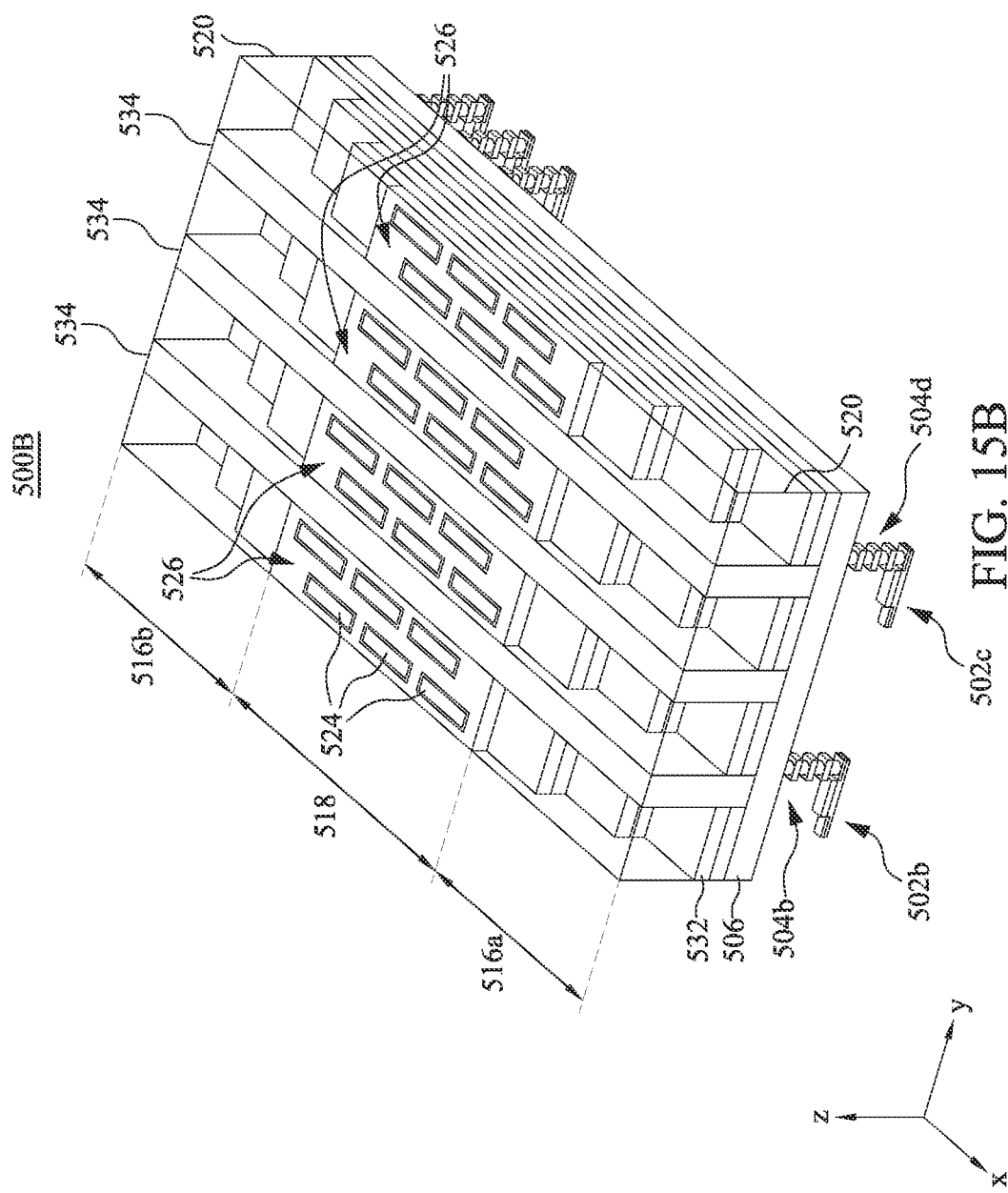
Figure 15A:
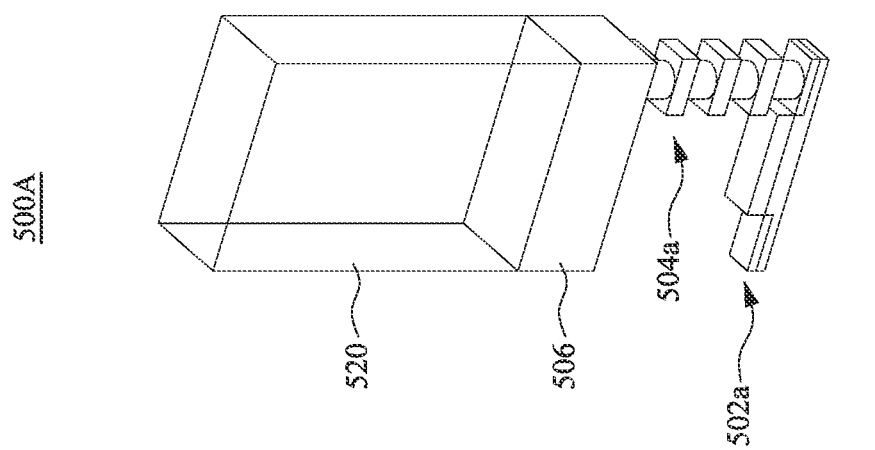

Corresponding to operation 424, FIGS. 15A and 15B illustrate the resulting perspective views of the first portion 500A and the second portion 500B including an isolation region 534 is formed in the second trenches 528 at one of the various stages of fabrication, in accordance with some embodiments. The isolation region 534 may include an insulating material similar as the insulating layers 508.

Corresponding to operation 426, FIGS. 16A and 16B illustrate the resulting perspective views of the first portion 500A and the second portion 500B including staircase vias 536a formed in the interface region 516a and staircase vias 536b in the interface region 516b at one of the various stages of fabrication, in accordance with some embodiments. In some embodiments, the staircase vias 536a and 536b (collectively, staircase vias 536) can be formed in the ILD 520 of the interface portions 516a and 516b, respectively. The staircase vias 536 may be formed from a conducting material, for example, tungsten (W), copper (Cu), cobalt (Co), etc. In some embodiments, the staircase vias 536 may be formed using a dual damascene process. For example, a cavity may be formed in the ILD 520. In some embodiments, a spacer layer may deposited on a top surface of the memory device 500 (e.g., a top surface of the topmost insulating layer 508 and the ILD 520) and throughholes formed in the spacer layer at locations corresponding to staircase vias 536. In such embodiments, cavities may not be formed in the staircase vias 536.

In some embodiments, a diffusion barrier (e.g., a Ta based material) may be deposited in each of the cavities, and a thin metal (e.g., Cu) seed layer is deposited on the diffusion barrier (e.g., using PVD, CVD, MBOE, ALD, etc.). This is followed by electroplating of the metal (e.g., Cu) on the metal seed layer until the metal fills the trenches and projects axially upwards of the ILD 520. This process can be repeated until the staircase vias 536 having a desired height are obtained.

Figure 17B:
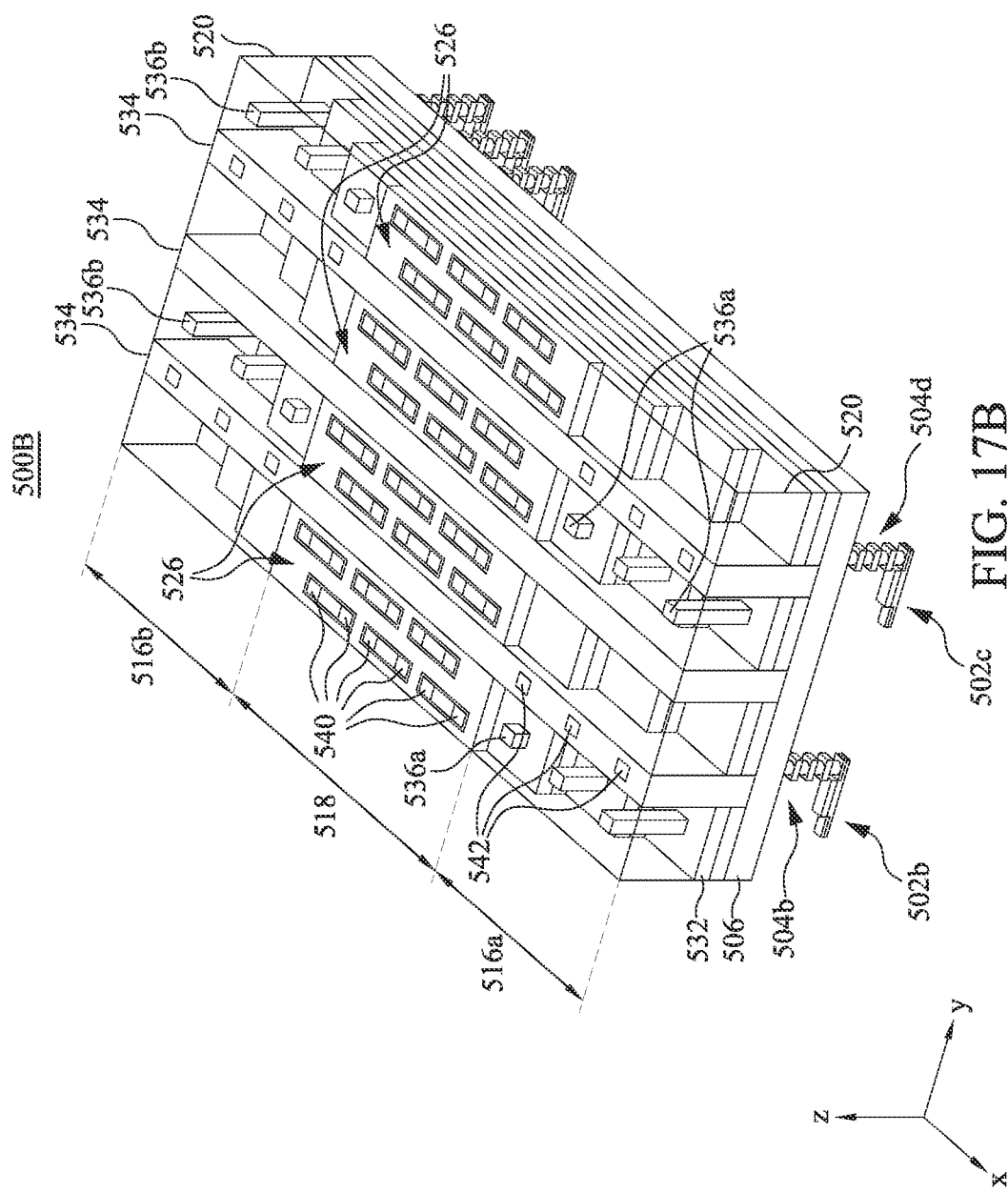
Figure 17A:
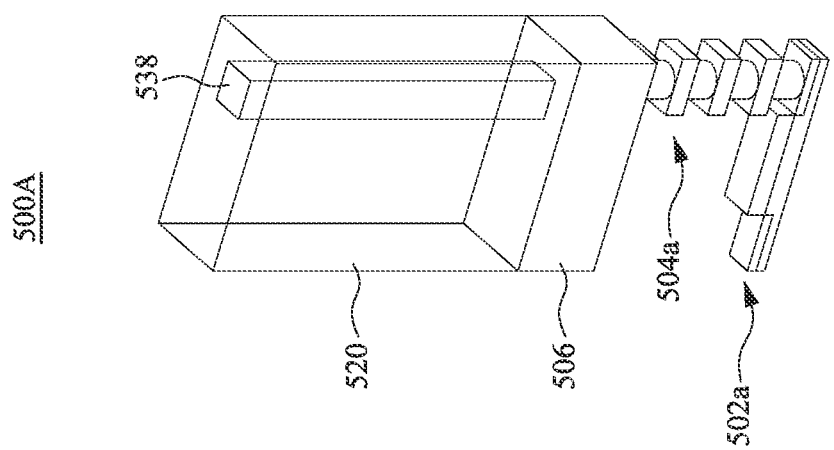

Corresponding to operation 428, FIGS. 17A and 17B illustrate the resulting perspective views of the first portion 500A including a conductive structure 538 (e.g., conductive structure 246a) and the second portion 500B including SL/BL 540 (e.g., SL/BL 340, 246d and 246e) and WL vias 542 (e.g., WL vias 320, 246b, and 246c) having been concurrently or substantially simultaneously formed at one of the various stages of fabrication, in accordance with some embodiments.

The conductive structure 538, SL/BL 540, and WL vias 542 may be concurrently formed by concurrently etching the ILD 520 in the first portion 500A and the axial ends of the inner spacers 524 and portions of the isolation region 534 in the second portion 500B, through the etch stop layer 506 and down to the interconnect structures 504. The ILD 520, inner spacers 524, and the isolation region 534 may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof. As a non-limiting example, a source power of about 10 Watts to about 3,000 Watts, a bias power of about 0 watts to about 3,000 watts, a pressure of about 1 millitorr to about 5 torr, and an etch gas flow of about 0 sccm to about 5,000 sccm may be used in the etching process. However, it is noted that source powers, bias powers, pressures, and flow rates outside of these ranges are also contemplated.

Next, conductive structure 538, SL/BL 540, and WL vias 542 may be formed, for example, using an epitaxial layer growth process such that the conductive structure 538 is located over the interconnect structure 504a, the SLs/BLs 540 are located on opposite axial ends of the inner spacer 524 and over the interconnect structures 504c, and the WL vias 542 are located at opposite axial ends of the second portion 500B and over the interconnect structures 504b and

504d-504f, each extending from the interconnect structures 504 to a top surface of the ILD 520, inner spacer 524 and isolation region 534. In some embodiments, a control deposition step may be performed for forming the conductive structure 538, SL/BL 540, and WL vias 542 such that the deposition step is stopped when a height of the conductive structure 538, SL/BL 540, and WL vias 542 in the Z-direction are equal to a height of the stack 512. In other embodiments, a CMP operation may be performed after formation of the conductive structure 538, SL/BL 540, and WL vias 542 so as to ensure a top surface of each of the topmost insulating layer 508, the memory layer, the channel layer, the inner spacer 524 conductive structure 538, SL/BL 540, and WL vias 542 lie in the same X-Y plane or are level with a top surface of the topmost insulating layer 508. In still other embodiments, a top surface of the conductive structure 538, SL/BL 540, and WL vias 542 may be higher than a top surface of the topmost insulating layer 508. In some other embodiments, the top surface of the conductive structure 538, SL/BL 540, and WL vias 542 may be lower than the top surface of the topmost insulating layer 508.

In-situ doping (ISD) may be applied to form doped SL/BL 540, thereby creating the junctions for each memory cell in the memory portion 518. N-type and p-type FETs are formed by implanting different types of dopants to selected regions (e.g., doped SL/BL 540) of the memory cell to form the junction(s). N-type devices can be formed by implanting arsenic (As) or phosphorous (P), and p-type devices can be formed by implanting boron (B).

In some embodiments, the WL vias 542 may be formed in alternating isolation regions 534. For example, as shown in FIG. 17B, there are 3 WL vias 542 formed in first interface portion 516a and 3 WL vias 542 formed in the second interface portion 516b, all in one isolation region 534 (e.g., the leftmost isolation region 534 of the 3 isolation regions 534 shown in FIG. 17B). Then in the middle isolation region 534, no WL vias 542 are formed. Then in the rightmost isolation region 534, another 3 WL vias 542 are formed in the first interface portion 516a and 3 WL vias 542 are formed in the second interface portion 516b.

Furthermore, in some embodiments, the SL/BL 540 may not be formed in the isolation regions 534. For example, as shown in FIG. 17B, there are no SL/BL 540 formed in the isolation regions 534. Previously, vias were formed in the isolation region 534 in the memory portion 518 in order to electrically connect the SL/BL 540 to the SL/BL drivers that were formed below the etch stop layer 506. In contrast, these vias in the isolation regions 534 in the memory portion 518 are no longer necessary, since the SL/BL 540 are connected to the interconnect structures 504 formed below the etch stop layer 506.

In a prior approach, memory devices were fabricated with vias that did not penetrate the etch stop layer that is disposed between the (1) peripheral circuits and the WL/SL/BL drivers and (2) the memory array. This required extra vias that connected the peripheral circuits and the WL/SL/BL drivers to the memory array, which led to the need for an extra mask, reduced density, and increased fabrication costs. In contrast, the conductive structure 538, SL/BL 540, and WL vias 542 are formed concurrently or substantially simultaneously by puncturing the etch stop layer 506, which reduces fabrication steps and the area.

In some embodiments, the conductive structures 538 (in the first portion 500A) and the conductive structures 536, the WL vias 542, and the SL/BL 540 (in the second portion 500B) may be formed concurrently or substantially simultaneously. For example, the ILD 520, inner spacers 524, and the isolation regions 534 may be etched at the same time to create recesses to form the conductive structures 536, conductive structures 538, the WL vias 542, and the SL/BL 540. Then the conductive structures 536, conductive structures 538, the WL vias 542, and the SL/BL 540 may be concurrently formed as discussed above.

Corresponding to operation 430, FIGS. 18A and 18B illustrate the resulting perspective views of the first portion 500A including an interconnect structure 544 connected to the conductive structure 538 and the second portion 500B including an interconnect structure 548 (e.g., interconnect structure 316) connected to the one or more SL/BL 540 in the memory portion 518 and interconnect structures 546a and 546b (collectively interconnect structure 546) (e.g., interconnect structures 346) in the interface portions 516a and 516b, respectively, formed at one of the various stages of fabrication, in accordance with some embodiments. The interconnect structures 548 may also be formed that couple SL/BL 540 of the various memory strings located parallel to each other in the second direction (e.g., the Y-direction).

The interconnect structures 544, 546, and 548 may be formed from a conducting material, for example, tungsten (W), copper (Cu), cobalt (Co), etc. The interconnect structures 544, 546, and 548 may also be formed using a dual damascene process, for example, after formation of the conductive structure 538, SL/BL 540, and WL vias 542 before removing the spacer layer. While the first and second portions 500A and 500B is shown without the spacer layer, in some embodiments, the spacer layer may remain included in the final memory device 500.

The interconnect structure 544 electrically connects the transistor 502a of a peripheral circuit to other transistors within the peripheral circuit, another peripheral circuit, or the memory array. The interconnect structures 546 electrically connects the transistors 502b and 502c of the WL driver to the WLs 532 which provide a gate voltage to various memory cells within the memory portion 518. The interconnect structures 548 can electrically connect the SL/BL 540 to other SL/BL 540 that are parallel with one another in the y-direction.

Figure 19C:
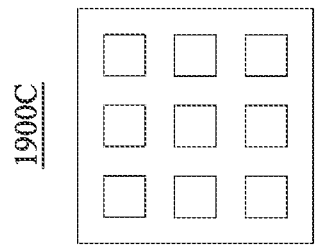
FIGS. 19A, 19B, and 19C illustrate top view of example vias, in accordance with some embodiments.
Figure 19B:
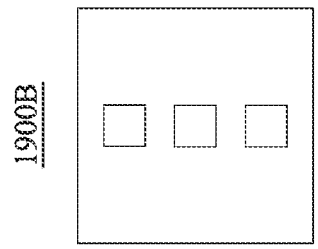
Figure 19A:
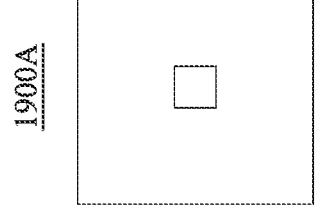

FIGS. 19A-21C illustrate top view of example vias, in accordance with some embodiments. FIG. 19A illustrates a top view of a single via 1900A having a square or substantially square shape. FIG. 19B illustrates a top view of a line of vias 1900B having a square or substantially square shape. FIG. 19C illustrates a top view of a matrix of vias 1900C having a square or substantially square shape.

Figure 20A:
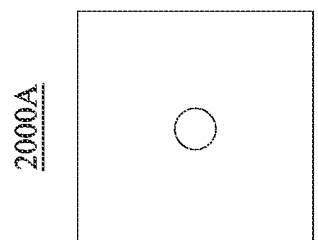
FIGS. 20A, 20B, and 20C illustrate top views of more example vias, in accordance with some embodiments.
Figure 20B:
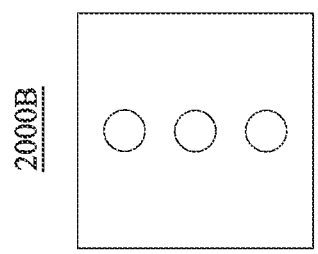
Figure 20C:
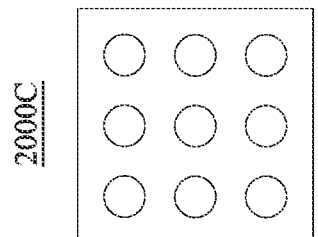

FIG. 20A illustrates a top view of a single via 2000A having a circular or substantially circular shape. FIG. 20B illustrates a top view of a line of vias 2000B having a circular or substantially circular shape. FIG. 20C illustrates a top view of a matrix of vias 2000C having a circular or substantially circular shape.

Figure 21C:
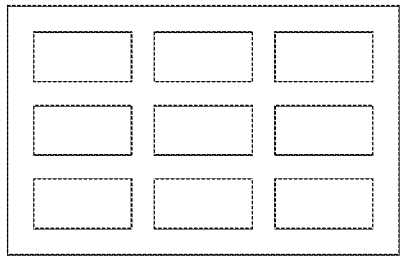
FIGS. 21A, 21B, and 21C illustrate top views of still more example vias, in accordance with some embodiments.
Figure 21B:
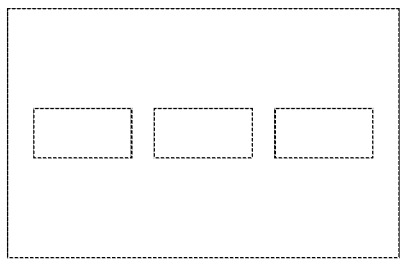
Figure 21A:
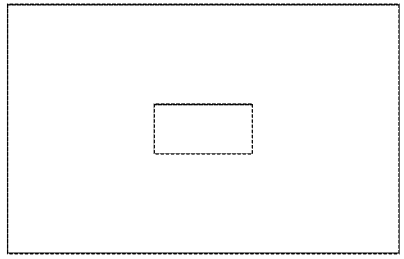

FIG. 21A illustrates a top view of a single via 2100A having a rectangular or substantially rectangular shape. FIG. 21B illustrates a top view of a line of vias 2100B having a rectangular or substantially rectangular shape. FIG. 21C illustrates a top view of a matrix of vias 2100C having a rectangular or substantially rectangular shape.

In one aspect of the present disclosure, a method for fabricating memory devices is disclosed. In one aspect, the method includes providing a substrate including a first area and a second area, forming a plurality of first transistors in the first area and a plurality of second transistors in the second area, forming a stack over the second area, wherein the stack comprises a plurality of insulating layers and a plurality of sacrificial layers alternatively stacked on top of each other, forming a memory array portion and an interface portion through the stack, wherein the memory array portion includes a plurality of memory strings and the interface portion includes a plurality of first conductive structures extending along a lateral direction, and simultaneously forming a plurality of second conductive structures in the first area and forming a plurality of third conductive structures in the second area, wherein the second conductive structures each vertically extends to electrically couple to at least one of the first transistors, and the third conductive structures each vertically extends through one of the plurality of memory strings to electrically couple to at least one of the second transistors.

In another aspect of the present disclosure, a method for fabricating memory devices is disclosed. The method includes forming a first transistor, a second transistor, and a third transistor separated apart from one another over a substrate, forming, over at least the second and third transistors, a plurality of first conductive structures arranged in a staircase profile, forming a memory array comprising a plurality of memory strings that each extends along a vertical direction, wherein each of the plurality of first conductive structures extends along a first lateral direction across one or more of the plurality of memory string, and simultaneously forming a second conductive structure, a third conductive structure, and a fourth conductive structure, each of the second to fourth conductive structures extending along the vertical direction, wherein the second conductive structure electrically couples to the first transistor; the third conductive structure, disposed next to one or more of the first conductive structures along a second lateral direction perpendicular to the first lateral direction, electrically couples to the second transistor; and the fourth conductive structure, extending through one of the memory strings, electrically couples to the third transistor.

In yet another aspect of the present disclosure, a memory device is disclosed. The memory device includes a plurality of transistors, a plurality of interconnect structures disposed above the plurality of transistors, an etch stop layer disposed above the plurality of interconnect structures, a plurality of memory strings, disposed above the etch stop layer, that each extend along a vertical direction, a first conductive structure, disposed above the plurality of interconnect structures, that extends along the vertical direction to penetrate through the etch stop layer to electrically couple to a first one of the plurality of transistors, and a second conductive structure, disposed above the plurality of interconnect structures, that extends along the vertical direction to penetrate through the etch stop layer to electrically couple to a second one of the plurality of transistors, wherein the first conductive structure is separated apart from the memory strings, and the second conductive structure is disposed inside one of the memory strings.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating memory devices, comprising:
   providing a substrate including a first area and a second area;
   forming a plurality of first transistors in the first area and a plurality of second transistors in the second area;
   forming a stack over the second area, wherein the stack comprises a plurality of insulating layers and a plurality of sacrificial layers alternatively stacked on top of each other;
   forming a memory array portion and an interface portion through the stack, wherein the memory array portion includes a plurality of memory strings and the interface portion includes a plurality of first conductive structures extending along a lateral direction; and
   simultaneously forming a plurality of second conductive structures in the first area and forming a plurality of third conductive structures in the second area, wherein the second conductive structures each vertically extends to electrically couple to at least one of the first transistors, and the third conductive structures each vertically extends through one of the plurality of memory strings to electrically couple to at least one of the second transistors.

2. The method of claim 1, prior to forming the stack, further comprising:
   forming a plurality of interconnect structures, each of which is connected to either at least one of the first transistors or at least one of the second transistors; and
   forming an etch stop layer over the plurality of interconnect structures.

3. The method of claim 2, wherein the operation of simultaneously forming a plurality of second conductive structures in the first area and forming a plurality of third conductive structures in the second area comprises:
   simultaneously forming a plurality of first vertical recesses penetrating through at least the etch stop layer in the first area and forming a plurality of second vertical recesses penetrating through at least the etch stop layer in the second area; and
   filling the plurality of first vertical recesses and the plurality of second vertical recesses with a conductive material to form the plurality of second conductive structures and the plurality of third conductive structures, respectively.

4. The method of claim 1, wherein the plurality of third conductive structures comprises a first subset of the third conductive structures disposed in the memory array portion and a second subset of the third conductive structures disposed in the interface portion.

5. The method of claim 4, wherein the first subset of third conductive structures are aligned along a line extending in the lateral direction in which none of the second subset of third conductive structures is present.

6. The method of claim 4, wherein one of the plurality of first conductive structures is electrically coupled to one of the first subset of third conductive structures.

7. The method of claim 4, further comprising forming an isolation region over the second area of the substrate and extending in the lateral direction, wherein the first subset of third conductive structures are disposed in the isolation region and the second subset of third conductive structures are not disposed in the isolation region.

8. The method of claim 1, wherein each of the pluralities of second and third conductive structures has a circular, square, or rectangular shape.

9. A method for fabricating memory devices, comprising:
   forming a first transistor, a second transistor, and a third transistor separated apart from one another over a substrate;
   forming, over at least the second and third transistors, a plurality of first conductive structures arranged in a staircase profile;
   forming a memory array comprising a plurality of memory strings that each extends along a vertical direction, wherein each of the plurality of first conductive structures extends along a first lateral direction across one or more of the plurality of memory strings; and
   simultaneously forming a second conductive structure, a third conductive structure, and a fourth conductive structure, each of the second to fourth conductive structures extending along the vertical direction;
   wherein the second conductive structure electrically couples to the first transistor; the third conductive structure, disposed next to one or more of the first conductive structures along a second lateral direction perpendicular to the first lateral direction, electrically couples to the second transistor; and the fourth conductive structure, extending through one of the memory strings, electrically couples to the third transistor.

10. The method of claim 9, prior to forming the plurality of first conductive structures, further comprising:
   forming a plurality of interconnect structures, each of which is connected to at least one of the first, second or third transistors; and
   forming an etch stop layer over the plurality of interconnect structures.

11. The method of claim 10, wherein the operation of simultaneously forming the second, third, and fourth conductive structures comprises:
   simultaneously forming a plurality of vertical recesses penetrating through at least the etch stop layer; and
   filling the plurality of vertical recesses with a conductive material to form the second, third, and fourth conductive structures.

12. The method of claim 9, wherein the third conductive structure is disposed along a first dielectric spacer that extends in the first lateral direction and the fourth conductive structure is disposed along a second dielectric spacer that extends in the first lateral direction, and wherein the first and second dielectric spacers are in parallel with each other.

13. The method of claim 9, wherein the first transistor comprises a transistor operating as part of a circuit selected from the group consisting of: a power circuit, an input/output circuit, and a signal processing circuit.

14. The method of claim 9, wherein the second transistor comprises a transistor operating as part of a word line driver circuit and the third transistor comprises a transistor operating as part of a circuit selected from the group consisting of: a source line driver circuit and bit line driver circuit.

15. The method of claim 9, prior to simultaneously forming the second, third, and fourth conductive structures, further comprising forming an isolation region extending in the first lateral direction and including a first portion disposed over a first area of the substrate and a second portion disposed over a second area of the substrate, wherein the second transistor is disposed in the first area and the third transistor is disposed in the second area.

16. The method of claim 15, wherein the third conductive structure is disposed in the second portion of the isolation region, and the fourth conductive structure is offset from the first portion of the isolation region along the second lateral direction.

17. The method of claim 9, wherein each of the second to fourth conductive structures has a circular, square, or rectangular shape.

18. A memory device, comprising:
   a plurality of transistors;
   a plurality of interconnect structures disposed above the plurality of transistors;
   an etch stop layer disposed above the plurality of interconnect structures;
   a plurality of memory strings, disposed above the etch stop layer, that each extend along a vertical direction;
   a first conductive structure, disposed above the plurality of interconnect structures, that extends along the vertical direction to penetrate through the etch stop layer to electrically couple to a first one of the plurality of transistors; and
   a second conductive structure, disposed above the plurality of interconnect structures, that extends along the vertical direction to penetrate through the etch stop layer to electrically couple to a second one of the plurality of transistors;
   wherein the first conductive structure is separated apart from the memory strings, and the second conductive structure is disposed inside one of the memory strings.

19. The memory device of claim 18, wherein the first one of the plurality of transistors comprises a transistor operating as part of a circuit selected from the group consisting of: a power circuit, an input/output circuit, and a signal processing circuit, and the second one of the plurality of transistors comprises a transistor operating as part of a circuit selected from the group consisting of: a source line driver circuit and bit line driver circuit.

20. The memory device of claim 18, further comprising a third conductive structure that extends along a lateral direction and encloses the second conductive structure.

* * * * *